(12) United States Patent
Uekuri

(10) Patent No.: US 10,319,332 B2
(45) Date of Patent: Jun. 11, 2019

(54) DISPLAY APPARATUS AND CONTROL METHOD HAVING SEMICONDUCTOR APPARATUSES

(71) Applicant: Japan Display Inc., Tokyo (JP)

(72) Inventor: Tamotsu Uekuri, Tokyo (JP)

(73) Assignee: Japan Display Inc., Tokyo (JP)

( * ) Notice: Subject to any disclaimer, the term of this patent is extended or adjusted under 35 U.S.C. 154(b) by 81 days.

(21) Appl. No.: 15/471,530

(22) Filed: Mar. 28, 2017

(65) Prior Publication Data

US 2017/0287434 A1 Oct. 5, 2017

(30) Foreign Application Priority Data

Mar. 30, 2016 (JP) ................. 2016-069292

(51) Int. Cl.
*G09G 5/00* (2006.01)
*G09G 3/20* (2006.01)
*H01L 27/12* (2006.01)

(52) U.S. Cl.
CPC ............ *G09G 5/003* (2013.01); *G09G 3/20* (2013.01); *H01L 27/124* (2013.01); *G09G 2300/0452* (2013.01); *G09G 2310/027* (2013.01); *G09G 2310/0218* (2013.01); *G09G 2310/0297* (2013.01); *G09G 2310/08* (2013.01); *G09G 2320/0209* (2013.01); *G09G 2330/026* (2013.01); *G09G 2330/027* (2013.01); *G09G 2370/08* (2013.01)

(58) Field of Classification Search
CPC .. G09G 5/003; G09G 5/20; G09G 2300/0452; G09G 2310/0218; G09G 2310/027; G09G 2310/0297; G09G 2310/08; G09G 2320/0209; G09G 2330/026; G09G 2330/027; G09G 2370/08; H01L 27/124
See application file for complete search history.

(56) References Cited

U.S. PATENT DOCUMENTS

2004/0119929 A1 6/2004 Tanaka et al.
2016/0189595 A1* 6/2016 Choi .................... G09G 3/2092
345/212

FOREIGN PATENT DOCUMENTS

JP 2004-061688 A 2/2004

* cited by examiner

*Primary Examiner* — Lisa S Landis
(74) *Attorney, Agent, or Firm* — Michael Best & Friedrich LLP

(57) ABSTRACT

According to an aspect, a display apparatus includes: a plurality of pixels formed on a substrate; a plurality of semiconductor apparatuses, each of which is coupled to a part of the pixels, the part being different for each semiconductor apparatus; and wiring that couples the semiconductor apparatuses to one another. Each semiconductor apparatus includes a drive signal output circuit configured to output a drive signal to the part of the pixels, and an output controller configured to: output and receive, to and from other semiconductor apparatuses, a drive communication signal including a drive start communication signal indicating reception of a drive start signal to start driving the pixels via the wiring; and cause the drive signal output circuit to output the drive signal when determining that all the semiconductor apparatuses have received the drive start signals in accordance with the drive start communication signal.

16 Claims, 20 Drawing Sheets

FIG.11

DISPLAY APPARATUS AND CONTROL METHOD HAVING SEMICONDUCTOR APPARATUSES

CROSS-REFERENCE TO RELATED APPLICATIONS

This application claims priority from Japanese Application No. 2016-069292, filed on Mar. 30, 2016, the contents of which are incorporated by reference herein in its entirety.

BACKGROUND

1. Technical Field

The present invention relates to a display apparatus that displays an image, a control method, and a semiconductor apparatus.

2. Description of the Related Art

Recent years have seen higher-definition display apparatuses, i.e., display apparatuses that include an increasing number of pixels. Such an increase in the number of pixels requires a plurality of driver integrated circuits (ICs) for driving the pixels in a display apparatus.

As a related art, Japanese Patent Application Laid-open Publication No. 2004-061688 discloses a liquid crystal display apparatus that includes a plurality of driver ICs.

A display apparatus including a plurality of driver ICs may cause an overcurrent condition between driver ICs if one driver IC outputs drive signals for driving pixels while no other driver ICs output the drive signals.

When overcurrent flows between one driver IC and another driver IC, circuits or wiring of the display apparatus may be affected by the overcurrent.

For the foregoing reasons, there is a need for a display apparatus, a control method, and a semiconductor apparatus that can prevent only a part of the semiconductor apparatuses from outputting drive signals.

SUMMARY

According to an aspect, a display apparatus includes: a plurality of pixels formed on a substrate; a plurality of semiconductor apparatuses, each of which is coupled to a part of the pixels, the part being different for each semiconductor apparatus; and wiring that couples the semiconductor apparatuses to one another. Each semiconductor apparatus includes a drive signal output circuit configured to output a drive signal to the part of the pixels, and an output controller configured to: output and receive, to and from other semiconductor apparatuses, a drive communication signal including a drive start communication signal indicating reception of a drive start signal to start driving the pixels via the wiring; and cause the drive signal output circuit to output the drive signal when determining that all the semiconductor apparatuses have received the drive start signals in accordance with the drive start communication signal.

According to another aspect, a control method performed by a plurality of semiconductor apparatuses, each of which is coupled to a part of a plurality of pixels, the part being different for each semiconductor apparatus, the control method includes: outputting and receiving, to and from other semiconductor apparatuses, a drive communication signal including a drive start communication signal indicating reception of a drive start signal to start driving the pixels; determining whether all the semiconductor apparatuses have received the drive start signal in accordance with the drive start communication signal; and starting output of the drive signal.

According to another aspect, a semiconductor apparatus includes: a drive signal output circuit configured to output a drive signal; an output controller configured to control the drive signal output circuit; and an external input interface configured to receive a drive start signal. The output controller is configured to output and receive, to and from other semiconductor apparatuses, a drive communication signal including a drive start communication signal indicating reception of the drive start signal, and the output controller is configured to cause the drive signal output circuit to output the drive signal when receiving the drive start communication signal and the drive start signal.

BRIEF DESCRIPTION OF THE DRAWINGS

FIG. 11 is a flowchart illustrating an operation of the driver ICs of the display apparatus according to the second embodiment;

DETAILED DESCRIPTION

Figure 1:
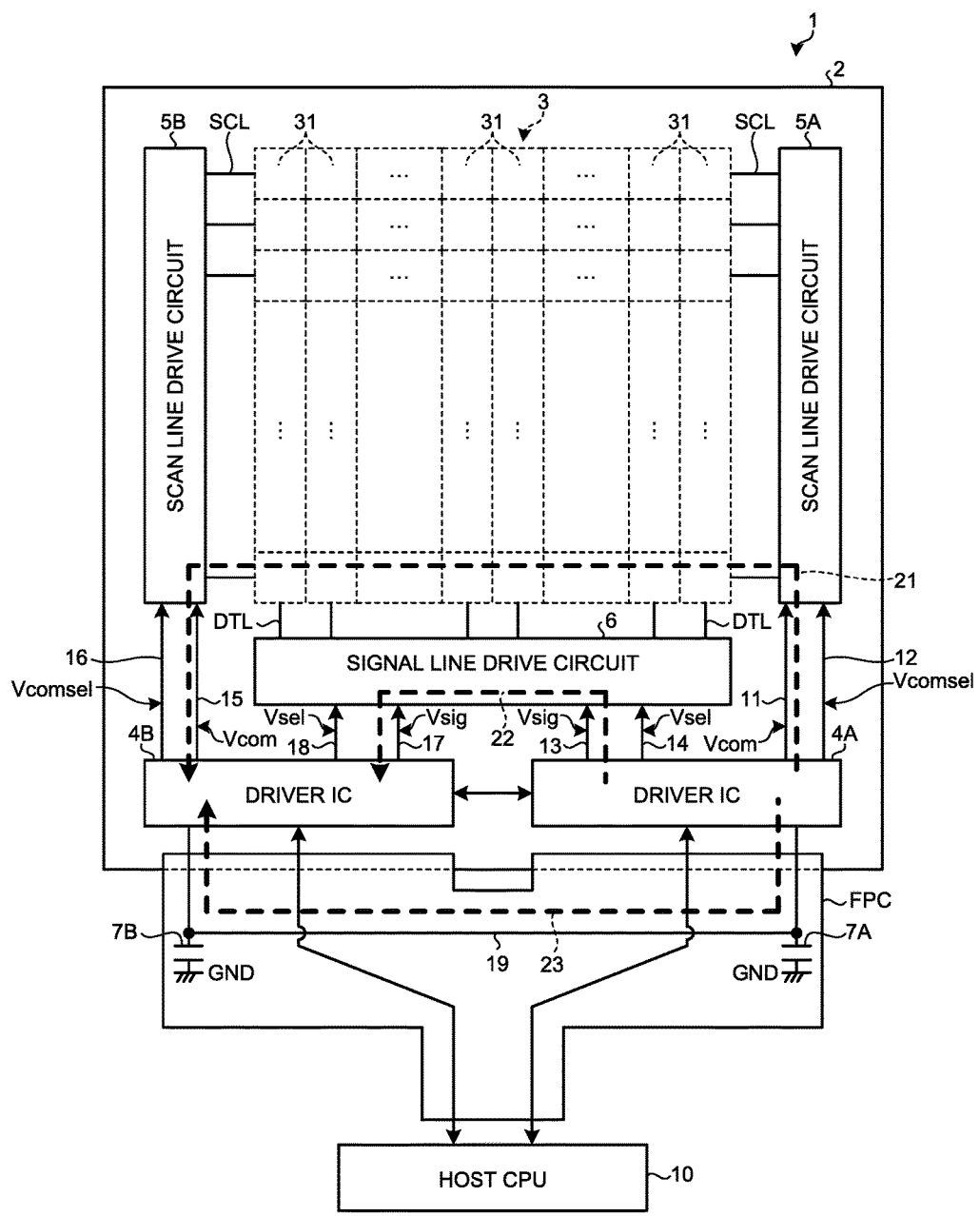
FIG. 1 is a block diagram illustrating an example of a configuration of a display apparatus according to a first embodiment of the present invention.

Modes (embodiments) for carrying out the present invention will be described in detail with reference to the drawings. The present invention is not limited to the embodiments described below. Components described below include a component that is easily conceivable by those skilled in the art and substantially the same component. The components described below can be appropriately combined. The disclosure is merely an example, and the present invention naturally encompasses appropriate modifications maintaining the gist of the invention that is easily conceivable by those skilled in the art. To further clarify the description, a width, a thickness, a shape, and the like of each component may be schematically illustrated in the drawings as compared with an actual aspect. However, this is merely an example and interpretation of the invention is not limited thereto. The same elements as those described in the drawings that have already been discussed are denoted by the same reference numerals throughout the description and the drawings, and detailed description thereof will not be repeated in some cases.

First Embodiment

FIG. 1 is a block diagram illustrating an example of a configuration of a display apparatus according to a first embodiment of the present invention.

As illustrated in FIG. 1, this display apparatus 1 includes a substrate 2. The display apparatus 1 includes a pixel group 3 formed on the substrate 2. The pixel group 3 includes a plurality of pixels 31 arranged in a matrix of M rows×N columns, where M and N are natural numbers larger than or equal to two.

The pixels 31 may be liquid crystal pixels or organic electro luminescence (EL) pixels.

The display apparatus 1 includes driver ICs 4A and 4B that output drive signals for driving the pixel group 3.

The driver ICs 4A and 4B drive M×N pixels 31.

The driver IC 4B drives M×i pixels 31 in the first to i-th columns (i is a natural number where $1 \leq i < N$ is satisfied). The driver IC 4A drives M×(N−i) pixels 31 in the (i+1)-th to N-th columns. A part of the pixels 31 driven by the driver IC 4B may overlap with a part of the pixels 31 driven by the driver IC 4A.

The driver ICs 4A and 4B are semiconductor apparatuses (semiconductor chips) made by, for example, chip-on-glass (COG) technology. The technology is not limited to the COG, and the semiconductor apparatuses may be made by chip-on-film or chip-on-flexible (COF) technology by which semiconductor chips are fabricated on a printed circuit board.

The display apparatus 1 includes the driver IC 4B that drives M×i pixels 31 in the first to i-th columns and the driver IC 4A that drives M×(N−i) pixels 31 in the (i+1)-th to N-th columns. In other words, each of the drivers IC 4A and 4B is coupled to a part of the pixels.

This configuration allows the pixel group 3 of the display apparatus 1 to display a high-resolution image even when the driver ICs 4A and 4B, which are semiconductor apparatuses, have a limited number of terminals.

The driver ICs 4A and 4B are electrically coupled to a host central processing unit (CPU) 10 that is an application processor via a printed circuit board such as a flexible printed circuit board FPC. The driver ICs 4A and 4B output drive signals for driving the pixel group 3 in accordance with input signals received from the host CPU 10.

The driver IC 4A is electrically coupled to a ground potential GND via a capacitor 7A disposed on the flexible printed circuit board FPC. The driver IC 4B is electrically coupled to a ground potential GND via a capacitor 7B disposed on the flexible printed circuit board FPC. The coupling point between the driver IC 4A and the capacitor 7A is electrically coupled to the coupling point between the driver IC 4B and the capacitor 7B via wiring 19. The capacitors 7A and 7B are not necessarily required.

This configuration allows the driver ICs 4A and 4B to have the same ground potential.

The display apparatus 1 includes a scan line drive circuit 5A that selects each row of the pixel group 3 in a line-sequential manner in accordance with a drive signal output from the driver IC 4A, and that outputs a scan signal to a scan line SCL in the selected row. The display apparatus 1 includes a scan line drive circuit 5B that selects each row of the pixel group 3 in a line-sequential manner in accordance with a drive signal output from the driver IC 4B, and that outputs a scan signal to a scan line SCL in the selected row.

The display apparatus 1 includes a signal line drive circuit 6 that outputs image signals to a plurality of image signal lines DTL in accordance with the drive signals output from the driver ICs 4A and 4B.

Figure 2:
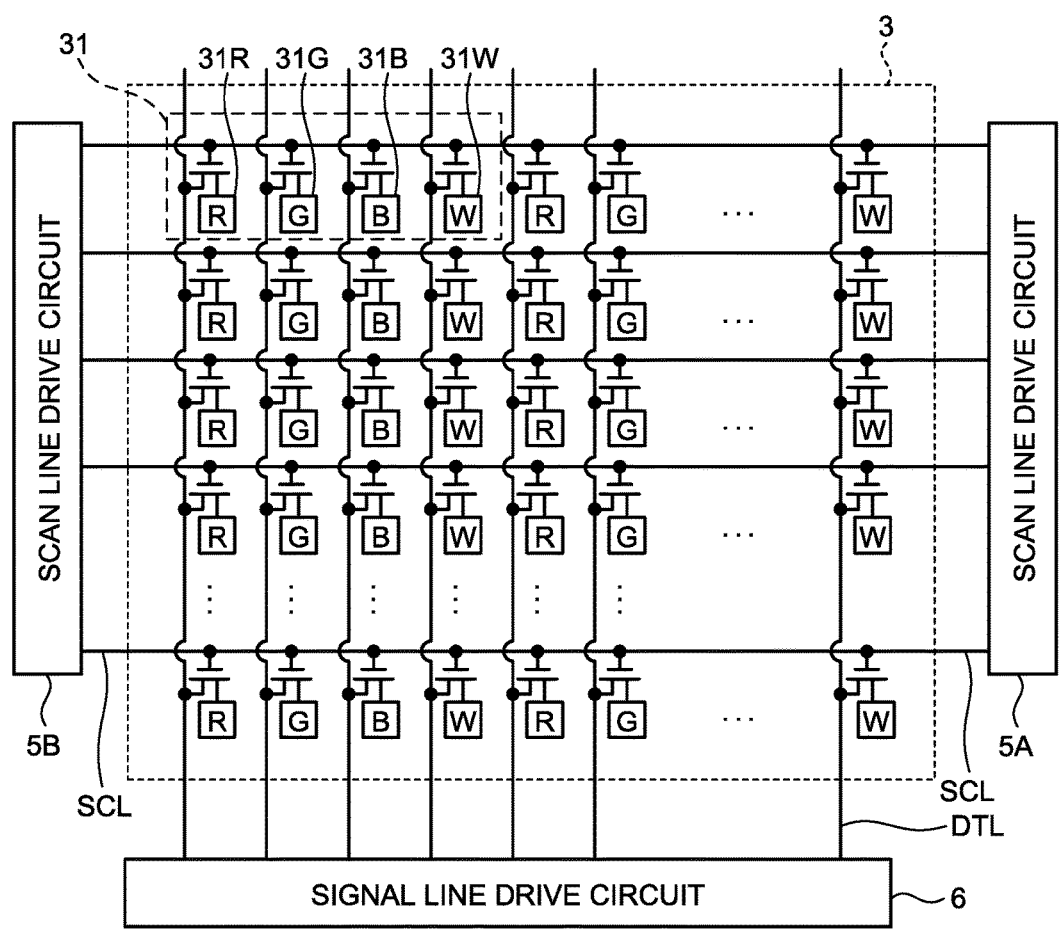
FIG. 2 is a diagram illustrating an example of a configuration of a pixel group of the display apparatus according to the first embodiment.

FIG. 2 is a diagram illustrating an example of a configuration of the pixel group of the display apparatus according to the first embodiment.

Each pixel 31 includes a first subpixel 31R that displays a first color (e.g., red), a second subpixel 31G that displays a second color (e.g., green), a third subpixel 31B that displays a third color (e.g., blue), and a fourth subpixel 31W that displays a fourth color (e.g., white).

The subpixels are units for display that can be individually controlled. Each subpixel corresponds to a region defined by image signal lines DTL and scan lines SCL, or a thin film transistor (TFT) that is controlled by a image signal line DTL and a scan line SCL.

In the first embodiment, each pixel 31 includes four subpixels that display four different colors, but the present invention is not limited to this. Each pixel 31 does not necessarily include four subpixels that display four different colors. Each pixel 31 may include, for example, three subpixels that display three different colors, which are the first color, the second color, and the third color. The combination of the colors of the subpixels that constitute each pixel is not limited to the aforementioned colors. The combination of the colors may include cyan, magenta, or yellow. Each pixel 31 may be configured only by the fourth subpixel 31W that displays the fourth color, so that the display apparatus 1 displays black and white images. When a display apparatus includes subpixels that display different colors, each subpixel has, for example, a color filter of a different color. In other words, each subpixel is associated with a color filter having a different color.

Referring back to FIG. 1, the driver IC 4A outputs, to the scan line drive circuit 5A, a scan signal Vcom having a potential to be applied to a scan line SCL via wiring 11. The driver IC 4A outputs, to the scan line drive circuit 5A, a drive selection signal Vcomsel for selecting a scan line SCL to which the scan signal Vcom is applied via wiring 12.

The scan line drive circuit 5A is a shift register that applies the scan signal Vcom to a scan line SCL in a row selected by the drive selection signal Vcomsel.

The driver IC 4B outputs, to the scan line drive circuit 5B, a scan signal Vcom having a potential to be applied to a scan line SCL via wiring 15. The driver IC 4B outputs, to the scan line drive circuit 5B, a drive selection signal Vcomsel for selecting a scan line SCL to which the scan signal Vcom is applied via wiring 16.

The scan line drive circuit 5B is a shift register that applies the scan signal Vcom to a scan line SCL in a row selected by the drive selection signal Vcomsel.

The driver ICs 4A and 4B each output a drive selection signal Vcomsel for selecting the same scan line SCL on the same row to the scan line drive circuits 5A and 5B, respectively. Thus, the scan line drive circuits 5A and 5B output the scan signals Vcom to the respective ends of the same scan line SCL in the same row at substantially the same time.

The driver ICs 4A and 4B may each output a drive selection signal Vcomsel for selecting a different scan line SCL on a different row to the scan line drive circuits 5A and 5B, respectively. For example, the scan line drive circuit 5A may be configured to control scan lines SCL in odd-numbered rows, and the scan line drive circuit 5B may be configured to control scan lines SCL in even-numbered rows.

This configuration enables the display apparatus 1 to appropriately drive the signal lines SCL even when many pixels are aligned in each column or the scan lines SCL have a large parasitic capacitance.

The driver IC 4A outputs image signals Vsig to be applied to a plurality of pixels 31 in the (n+1)-th to N-th columns of a row selected by the scan signal Vcom to the signal line drive circuit 6 via wiring 13. The image signals to be applied to the pixels 31 each include four sub-image signals that are time-division multiplexed and are applied to the four sub-pixels included in each pixel 31. Such sub-image signals may be applied to the four subpixels in each pixel 31 simultaneously via different wiring.

This configuration can reduce the number of lines of wiring 13 between the driver IC 4A and the signal line drive circuit 6 in the display apparatus 1.

The driver IC 4A outputs an image selection signal Vsel that indicates timing at which the four sub-image signals are time-division multiplexed to the signal line drive circuit 6 via wiring 14.

The driver IC 4B outputs image signals Vsig to be applied to a plurality of pixels 31 in the first to n-th columns of a row selected by the scan signal Vcom to the signal line drive circuit 6 via wiring 17. The image signals to be applied to the pixels 31 each include four sub-image signals that are time-division multiplexed and are applied to the four sub-pixels included in each pixel 31.

This configuration can reduce the number of lines of wiring 17 between the driver IC 4B and the signal line drive circuit 6 in the display apparatus 1.

The driver IC 4B outputs an image selection signal Vsel that indicates timing at which the four sub-image signals are time-division multiplexed to the signal line drive circuit 6 via wiring 18.

The signal line drive circuit 6 is a selector that separates the four sub-image signals that are time-division multiplexed from one another in accordance with the image selection signal Vsel and applies the separated sub-image signals to the respective subpixels via the image signal lines DTL.

In the first embodiment, the scan signal Vcom, the drive selection signal Vcomsel, the image signal Vsig, and the image selection signal Vsel are collectively referred to as drive signals. However, the drive signals are not limited to these signals. For example, when the display apparatus 1 includes an illuminator such as a backlight (not illustrated) that illuminates the pixel group 3 from the back, and when the driver ICs 4A and 4B are configured to control the backlight to be driven, a illumination drive signal for driving the backlight is included in the drive signals.

When receiving a drive start signal from the host CPU 10, the driver ICs 4A and 4B start outputting the drive signals for driving the pixel group 3. It is anticipated that for some reasons only one of the driver ICs 4A and 4B starts outputting the drive signals while the other one of the driver ICs 4A and 4B does not. Examples of such reasons include, but not limited to, a case in which the host CPU 10 outputs the drive start signal to only one of the driver ICs 4A and 4B and a case in which the driver IC 4A or 4B is inoperative.

When receiving a drive stop signal from the host CPU 10, the driver ICs 4A and 4B stop outputting the drive signals for driving the pixel group 3. It is anticipated that for some reasons only one of the driver ICs 4A and 4B stops outputting the drive signals while the other one of the driver ICs 4A and 4B does not. Examples of such reasons include, but not limited to, a case in which the host CPU 10 outputs the drive stop signal to only one of the driver ICs 4A and 4B.

When only the driver IC 4A outputs the drive signals while the driver IC 4B does not, potential difference across the driver ICs 4A and 4B is created, which may cause overcurrent flowing from the driver IC 4A to the driver IC 4B.

A first path that has the possibility of overcurrent is a path 21 from the driver IC 4A via the wiring 11, the scan line drive circuit 5A, the scan lines SCL, and the scan line drive circuit 5B to the driver IC 4B.

A second path that has the possibility of overcurrent is a path 22 from the driver IC 4A via the wiring 13 and the signal line drive circuit 6 to the driver IC 4B.

A third path that has the possibility of overcurrent is a path 23 from the driver IC 4A via the wiring 19 to the driver IC 4B.

When only the driver IC 4B outputs the drive signals while the driver IC 4A does not, a path that has the possibility of overcurrent is a reverse path of the path 21, the path 22, or the path 23.

When overcurrent flows between the driver ICs 4A and 4B, the driver IC 4A, the driver IC 4B, a circuit or wiring on the path 21, a circuit or wiring on the path 22, or a circuit or wiring on the path 23 may be affected by the overcurrent.

Therefore, the driver ICs 4A and 4B are configured not to allow only one of the driver ICs 4A and 4B to start outputting the drive signals while the other one of the driver ICs 4A and 4B does not.

This configuration can prevent the driver IC 4A, the driver IC 4B, a circuit or wiring on the path 21, a circuit or wiring on the path 22, or a circuit or wiring on the path 23 in the display apparatus 1 from being affected by the overcurrent.

Figure 3:
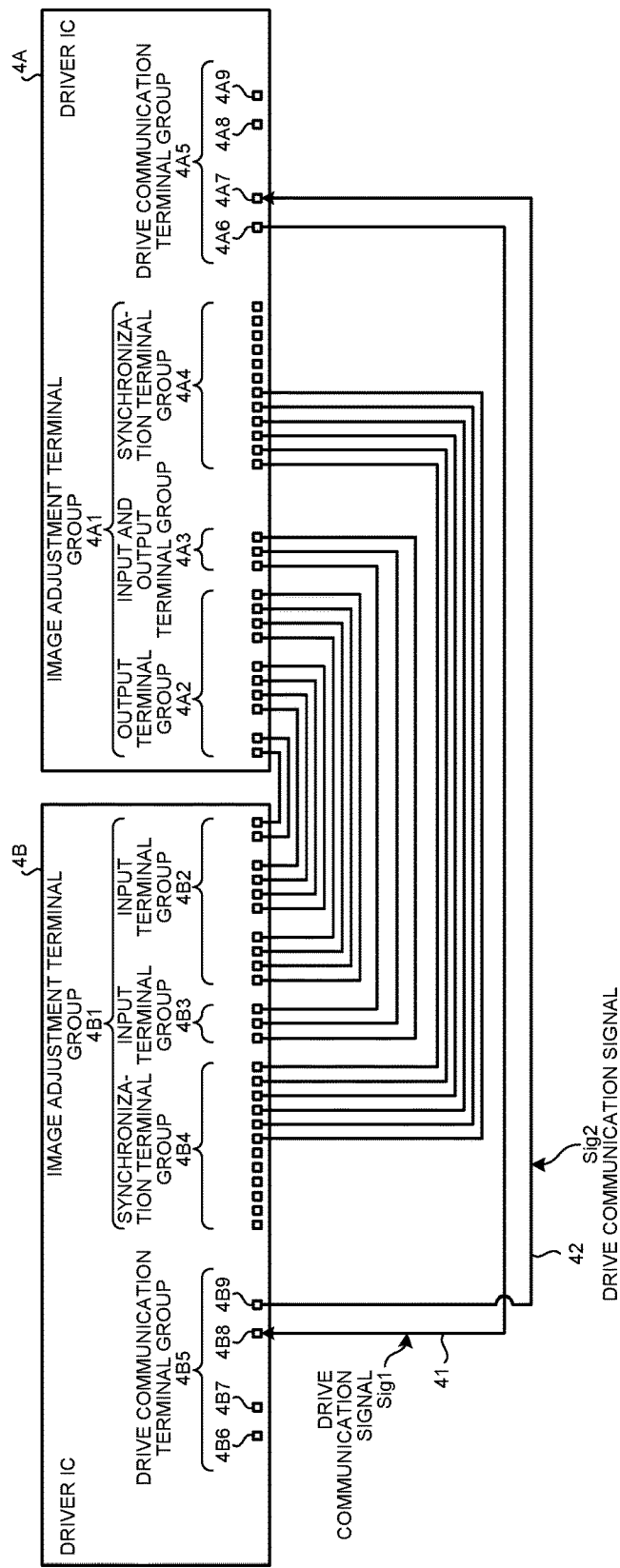
FIG. 3 is a diagram illustrating how driver ICs of the display apparatus are coupled to each other according to the first embodiment.

FIG. 3 is a diagram illustrating how the driver ICs of the display apparatus are coupled to each other according to the first embodiment.

The driver IC 4A includes an image adjustment terminal group 4A1 for transmitting and receiving image adjustment signals for adjusting an image displayed by M×(N−i) pixels 31 in the (i+1)-th to N-th columns driven by the driver IC 4A, and an image displayed by M×i pixels 31 in the first to i-th columns driven by the driver IC 4B.

The driver IC 4B includes an image adjustment terminal group 4B1 for transmitting and receiving image adjustment signals for adjusting an image displayed by M×i pixels 31 in the first to i-th columns driven by the driver IC 4B, and an image displayed by M×(N−i) pixels 31 in the (i+1)-th to N-th columns driven by the driver IC 4A.

The driver ICs 4A and 4B can adjust images displayed by the pixel group 3 by transmitting and receiving image adjustment signals between the image adjustment terminal groups 4A1 and 4B1. The driver ICs 4A and 4B each include an image adjustment circuit that calculates and stores therein an adjustment value for adjusting an output signal including the drive signal in accordance with an input signal. The image adjustment circuit of the driver IC 4A and that of the driver IC 4B can adjust images displayed by the pixel group 3 by transmitting and receiving the calculated and stored adjustment value between the image adjustment terminal groups 4A1 and 4B1.

The driver ICs 4A and 4B each calculate a sub-image signal for driving the first subpixel 31R that displays a first primary color, a sub-image signal for driving the second subpixel 31G that displays a second primary color, a sub-image signal for driving the third subpixel 31B that displays a third primary color, and a sub-image signal for driving the fourth subpixel 31W that displays the fourth color in accordance with the values of input signals for the first, second, and third primary colors and an extension coefficient α.

The image adjustment terminal group 4A1 includes an output terminal group 4A2 for transmitting image adjustment signals from the driver IC 4A to the driver IC 4B, an input and output terminal group 4A3 for transmitting image adjustment signals from the driver IC 4A to the driver IC 4B and receiving image adjustment signals from the driver IC 4B to the driver IC 4A, and a synchronization terminal group 4A4 for synchronizing the driver IC 4A with the driver IC 4B.

The image adjustment terminal group 4B1 includes an input terminal group 4B2 for receiving image adjustment signals from the driver IC 4A to the driver IC 4B, an input terminal group 4B3 for receiving image adjustment signals from the driver IC 4A to the driver IC 4B, and a synchronization terminal group 4B4 for synchronizing the driver IC 4B with the driver IC 4A.

The driver IC 4A includes a drive communication terminal group 4A5 in addition to the image adjustment terminal group 4A1. The drive communication terminal group 4A5 is a terminal group for communicating, with other driver ICs, information as to starting or stopping of the output of the drive signals to M×(N−i) pixels 31 in the (i+1)-th to N-th columns. The drive communication terminal group 4A5 includes drive communication terminals 4A6, 4A7, 4A8, and 4A9.

The driver IC 4B includes a drive communication terminal group 4B5 in addition to the image adjustment terminal group 4B1. The drive communication terminal group 4B5 is a terminal group for communicating, with other driver ICs, information as to starting or stopping of the output of the drive signals to M×i pixels 31 in the first to i-th columns. The drive communication terminal group 4B5 includes drive communication terminals 4B6, 4B7, 4B8, and 4B9.

The drive communication terminal 4A6 of the driver IC 4A is electrically coupled to the drive communication terminal 4B8 of the driver IC 4B via wiring 41. The drive communication terminal 4A7 of the driver IC 4A is electrically coupled to the driver communication terminal 4B9 of the driver IC 4B via wiring 42. The wiring 41 corresponds to first wiring and the wiring 42 corresponds to second wiring according to the present invention.

The drive communication terminals 4A8 and 4A9 of the driver IC 4A are electrically coupled to other driver ICs when the display apparatus 1 includes three or more driver ICs. In the first embodiment, the display apparatus 1 includes two driver ICs 4A and 4B. Thus, the drive communication terminals 4A8 and 4A9 of the driver IC 4A are left uncoupled.

The drive communication terminals 4B6 and 4B7 of the driver IC 4B are electrically coupled to other driver ICs when the display apparatus 1 includes three or more driver ICs. In the first embodiment, the display apparatus 1 includes two driver ICs 4A and 4B. Thus, the drive communication terminals 4B6 and 4B7 of the driver IC 4B are left uncoupled.

The driver IC 4A outputs a drive communication signal Sig1 that indicates starting or stopping of the output of the drive signals to M×(N−i) pixels 31 in the (i+1)-th to N-th columns from the drive communication terminal 4A6 to the drive communication terminal 4B8 of the driver IC 4B. The drive communication signal is a signal to be output and received to and from other drivers. The drive communication signal includes a drive start communication signal to start output of the drive signal and a drive stop communication signal to stop output of the drive signal.

The driver IC 4B outputs a drive communication signal Sig2 that indicates starting or stopping of the output of the drive signals to M×i pixels 31 in the first to i-th columns from the drive communication terminal 4B9 to the drive communication terminal 4A7 of the driver IC 4A.

Figure 4:
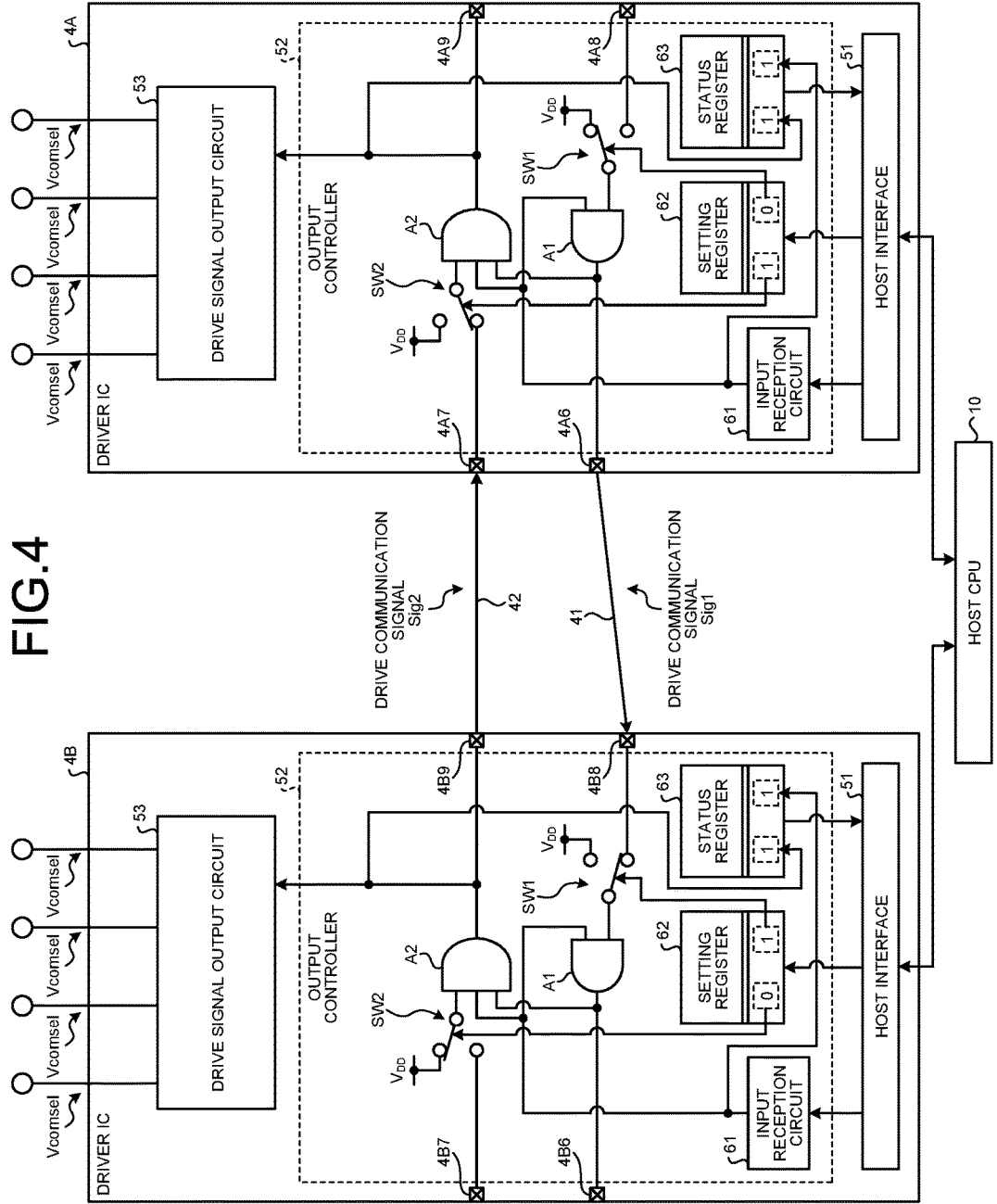
FIG. 4 is a diagram illustrating an inner configuration of the driver ICs of the display apparatus according to the first embodiment.

FIG. 4 is a diagram illustrating an inner configuration of the driver ICs of the display apparatus according to the first embodiment.

The driver ICs 4A and 4B have the same inner configuration. This configuration eliminates the need for preparing different types of components for the driver ICs 4A and 4B, and thus can reduce production costs.

The driver ICs 4A and 4B each include a host interface 51, an output controller 52, and a drive signal output circuit 53.

The host interface 51 of the driver IC 4A or 4B is a circuit that transmits and receives signals to and from the host CPU 10. The host interface 51 corresponds to an external input interface according to the present invention.

The output controller 52 of the driver IC 4A is a circuit that controls the drive signal output circuit 53 of the driver IC 4A to start outputting and stop outputting the drive signals in accordance with an input signal input from the host CPU 10 and the drive communication signal Sig2 input from the driver IC 4B.

The drive signal output circuit 53 of the driver IC 4A is a circuit that outputs the scan signal Vcom and the drive selection signal Vcomsel to the scan line drive circuit 5A and outputs the image signal Vsig and the image selection signal Vsel to the signal line drive circuit 6.

The drive signal output circuit 53 of the driver IC 4A starts outputting the drive signals when receiving a high-level signal from the output controller 52, and stops outputting the drive signals when receiving a low-level signal from the output controller 52.

The output controller 52 of the driver IC 4B is a circuit that controls the drive signal output circuit 53 of the driver IC 4B to start outputting and stop outputting the drive signals in accordance with an input signal input from the host CPU 10 and the drive communication signal Sig1 input from the driver IC 4A.

The drive signal output circuit 53 of the driver IC 4B is a circuit that outputs the scan signal Vcom and the drive selection signal Vcomsel to the scan line drive circuit 5B and outputs the image signal Vsig and the image selection signal Vsel to the signal line drive circuit 6.

The drive signal output circuit 53 of the driver IC 4B starts outputting the drive signals when receiving a high-level signal from the output controller 52, and stops outputting the drive signals when receiving a low-level signal from the output controller 52.

The output controllers 52 of the driver ICs 4A and 4B each include an input reception circuit 61, a setting register 62, a status register 63, a first AND gate circuit A1 having two input terminals, a second AND gate circuit A2 having three input terminals, and switch circuits SW1 and SW2. In FIG. 4, an output signal from the input reception circuit 61 is input to the second AND gate circuit A2, but the second AND gate circuit A2 may have two input terminals and the output signal from the input reception circuit 61 may not be input to the second AND gate circuit A2. The first AND gate circuit A1 corresponds to a first determination circuit and the second AND gate circuit A2 corresponds to a second determination circuit according to the present invention.

When receiving a drive start signal from the host CPU 10 via the host interface 51, the input reception circuit 61 of the driver IC 4A outputs a high-level signal to a first input terminal of the first AND gate circuit A1 and to a second input terminal of the second AND gate circuit A2. When receiving a drive stop signal from the host CPU 10 via the host interface 51, the input reception circuit 61 of the driver IC 4A outputs a low-level signal to the first input terminal of the first AND gate circuit A1 and to the second input terminal of the second AND gate circuit A2.

The drive start signal and the drive stop signal output from the host CPU 10 may be a one-bit signal. For example, when the one-bit signal is a high-level signal, the signal may be determined as the drive start signal, and when the one-bit signal is a low-level signal, the signal may be determined as the drive stop signal. The drive start signal and the drive stop signal may be commands having a plurality of bits.

The setting register 62 of the driver IC 4A is a two-bit register that is writable from the host CPU 10 and to which two-bit data is set by the host CPU 10. The setting register 62 of the driver IC 4A is set when, for example, the display apparatus 1 is powered on.

The lower bit of the setting register 62 of the driver IC 4A is coupled to the control terminal of the switch circuit SW1. The switch circuit SW1 couples a second input terminal of the first AND gate circuit A1 with a power supply potential $V_{DD}$ at a higher voltage level when the lower bit of the setting register 62 of the driver IC 4A is "0". The switch circuit SW1 couples the second input terminal of the first AND gate circuit A1 with the drive communication terminal 4A8 when the lower bit of the setting register 62 of the driver IC 4A is "1".

The first AND gate circuit A1 of the driver IC 4A generates an output signal corresponding to a first determination signal by a logical AND operation in accordance with the signal input to the first input terminal and the signal input to the second input terminal.

In the first embodiment, the lower bit of the setting register 62 of the driver IC 4A is set to "0" by the host CPU 10. Thus, the second input terminal of the first AND gate circuit A1 of the driver IC 4A receives the power supply potential $V_{DD}$ at the higher voltage level.

The output signal from the first AND gate circuit A1 of the driver IC 4A is a high-level signal when the input reception circuit 61 of the driver IC 4A receives the drive start signal from the host CPU 10, whereas the output signal is a low-level signal when the input reception circuit 61 of the driver IC 4A receives the drive stop signal from the host CPU 10.

The first AND gate circuit A1 of the driver IC 4A outputs the output signal to a third input terminal of the second AND gate circuit A2.

The first AND gate circuit A1 of the driver IC 4A outputs the output signal as the drive communication signal Sig1 to the driver IC 4B via the drive communication terminal 4A6.

The upper bit of the setting register 62 of the driver IC 4A is coupled to the control terminal of the switch circuit SW2. The switch circuit SW2 couples a first input terminal of the second AND gate circuit A2 with the power supply potential $V_{DD}$ at the higher voltage level when the upper bit of the setting register 62 of the driver IC 4A is "0". The switch circuit SW2 couples the first input terminal of the second AND gate circuit A2 with the drive communication terminal 4A7 when the upper bit of the setting register 62 of the driver IC 4A is "1".

The second AND gate circuit A2 of the driver IC 4A generates an output signal corresponding to a second determination signal by a logical AND operation in accordance with the signal input to the first input terminal, the signal input to the second input terminal, and the signal input to the third input terminal.

In the first embodiment, the upper bit of the setting register 62 of the driver IC 4A is set to "1" by the host CPU 10. Thus, the first input terminal of the second AND gate circuit A2 of the driver IC 4A receives the drive communication signal Sig2 input to the drive communication terminal 4A7 from the driver IC 4B.

The output signal from the second AND gate circuit A2 of the driver IC 4A is a high-level signal when the input reception circuit 61 of the driver IC 4A receives the drive start signal from the host CPU 10 and when the drive communication signal Sig2 is a high-level signal. The second AND gate circuit A2 of the driver IC 4A outputs a high-level output signal to the drive signal output circuit 53. This high-level signal causes the drive signal output circuit 53 of the driver IC 4A to start outputting the drive signals.

The output signal from the second AND gate circuit A2 of the driver IC 4A is a low-level signal when the input reception circuit 61 of the driver IC 4A receives the drive stop signal from the host CPU 10 or when the drive communication signal Sig2 is a low-level signal. The second AND gate circuit A2 of the driver IC 4A outputs a low-level output signal to the drive signal output circuit 53. This low-level signal causes the drive signal output circuit 53 of the driver IC 4A to stop outputting the drive signals.

The second AND gate circuit A2 of the driver IC 4A is a determination circuit that determines whether the drive start signal has been input to the driver IC 4B that is coupled to the driver IC 4A via the wiring 42 in accordance with the drive communication signal Sig2 from the driver IC 4B, which is coupled to the driver IC 4A via the wiring 42, and the result of the determination by the first AND gate circuit A1 of the driver IC 4A. In other words, the second AND gate circuit A2 of the driver IC 4A is a determination circuit that determines whether the drive start signal has been input to the driver IC 4B located at the left side (in a second direction) of the driver IC 4A in FIG. 4.

The status register 63 of the driver IC 4A is a two-bit register that is readable from the host CPU 10.

The lower bit of the status register 63 of the driver IC 4A is set to "1" when the output signal from the input reception circuit 61 is a high-level signal, and is set to "0" when the output signal from the input reception circuit 61 is a low-level signal.

The upper bit of the status register 63 of the driver IC 4A is set to "1" when the output signal from the second AND gate circuit A2 is a high-level signal, and is set to "0" when the output signal from the second AND gate circuit A2 is a low-level signal.

Thus, the host CPU 10 can obtain the status of the output signal from the input reception circuit 61 by reading the status register 63 of the driver IC 4A and referring to the lower bit thereof.

This configuration enables the host CPU 10 to determine whether the drive start signal or the drive stop signal has been received by the input reception circuit 61 of the driver IC 4A.

The host CPU 10 can obtain the status of the output signal from the second AND gate circuit A2 by reading the status register 63 of the driver IC 4A and referring to the upper bit thereof.

This configuration enables the host CPU 10 to determine whether the drive signal output circuit 53 of the driver IC 4A is controlled by the output controller 52 to output the drive signals.

When receiving a drive start signal from the host CPU 10 via the host interface 51, the input reception circuit 61 of the driver IC 4B outputs a high-level signal to the first input terminal of the first AND gate circuit A1 and to the second input terminal of the second AND gate circuit A2. When receiving a drive stop signal from the host CPU 10 via the host interface 51, the input reception circuit 61 of the driver IC 4B outputs a low-level signal to the first input terminal of the first AND gate circuit A1 and to the second input terminal of the second AND gate circuit A2.

The drive start signal and the drive stop signal output from the host CPU 10 may be a one-bit signal. For example, when the one-bit signal is a high-level signal, the signal may be determined as the drive start signal, and when the one-bit signal is a low-level signal, the signal may be determined as the drive stop signal. The drive start signal and the drive stop signal may be commands having a plurality of bits.

The setting register 62 of the driver IC 4B is a two-bit register that is writable from the host CPU 10 and to which two-bit data is set by the host CPU 10. The setting register 62 of the driver IC 4B is set when, for example, the display apparatus 1 is powered on.

The lower bit of the setting register 62 of the driver IC 4B is coupled to the control terminal of the switch circuit SW1. The switch circuit SW1 couples the second input terminal of the first AND gate circuit A1 with the power supply potential $V_{DD}$ at the higher voltage level when the lower bit of the setting register 62 of the driver IC 4B is "0". The switch circuit SW1 couples the second input terminal of the first AND gate circuit A1 with the drive communication terminal 4B8 when the lower bit of the setting register 62 of the driver IC 4B is "1".

The first AND gate circuit A1 of the driver IC 4B generates an output signal corresponding to a first determination signal by a logical AND operation in accordance with the signal input to the first input terminal and the signal input to the second input terminal.

In the first embodiment, the lower bit of the setting register 62 of the driver IC 4B is set to "1" by the host CPU 10. Thus, the second input terminal of the first AND gate circuit A1 of the driver IC 4B receives the drive communication signal Sig1 input to the drive communication terminal 4B8 from the driver IC 4A.

The output signal from the first AND gate circuit A1 of the driver IC 4B is a high-level signal when the input reception circuit 61 of the driver IC 4B receives the drive start signal from the host CPU 10 and when the drive communication signal Sig1 is a high-level signal. The output signal from the first AND gate circuit A1 of the driver IC 4B is a low-level signal when the input reception circuit 61 of the driver IC 4B receives the drive stop signal from the host CPU 10 or when the drive communication signal Sig1 is a low-level signal.

The first AND gate circuit A1 of the driver IC 4B is a determination circuit that determines whether the drive start signal has been input to the driver IC 4A that is coupled to the driver IC 4B via the wiring 41 in accordance with the drive communication signal Sig1 from the driver IC 4A, which is coupled to the driver IC 4B via the wiring 41, and the drive start signal from the input reception circuit 61 of the driver IC 4B. In other words, the first AND gate circuit A1 of the driver IC 4B is a determination circuit that determines whether the drive start signal has been input to the driver IC 4A located at the right side (in a first direction) of the driver IC 4B in FIG. 4.

The first AND gate circuit A1 of the driver IC 4B outputs the output signal to the third input terminal of the second AND gate circuit A2.

The upper bit of the setting register 62 of the driver IC 4B is coupled to the control terminal of the switch circuit SW2. The switch circuit SW2 couples the first input terminal of the second AND gate circuit A2 with the power supply potential $V_{DD}$ at the higher voltage level when the upper bit of the setting register 62 of the driver IC 4B is "0". The switch circuit SW2 couples the first input terminal of the second AND gate circuit A2 with the drive communication terminal 4B7 when the upper bit of the setting register 62 of the driver IC 4B is "1".

The second AND gate circuit A2 of the driver IC 4B generates an output signal corresponding to a second determination signal by a logical AND operation in accordance with the signal input to the first input terminal, the signal input to the second input terminal, and the signal input to the third input terminal.

In the first embodiment, the upper bit of the setting register 62 of the driver IC 4B is set to "0" by the host CPU 10. Thus, the first input terminal of the second AND gate circuit A2 of the driver IC 4B receives the power supply potential $V_{DD}$ at the higher voltage level.

The output signal from the second AND gate circuit A2 of the driver IC 4B is a high-level signal when the input reception circuit 61 of the driver IC 4B receives the drive start signal from the host CPU 10 and when the drive communication signal Sig1 is a high-level signal. The second AND gate circuit A2 of the driver IC 4B outputs a high-level output signal to the drive signal output circuit 53. This high-level signal causes the drive signal output circuit 53 of the driver IC 4B to start outputting the drive signals.

The output signal from the second AND gate circuit A2 of the driver IC 4B is a low-level signal when the input reception circuit 61 of the driver IC 4B receives the drive stop signal from the host CPU 10 or when the drive communication signal Sig1 is a low-level signal. The second AND gate circuit A2 of the driver IC 4B outputs a low-level output signal to the drive signal output circuit 53. This low-level signal causes the drive signal output circuit 53 of the driver IC 4B to stop outputting the drive signal.

The second AND gate circuit A2 of the driver IC 4B outputs the output signal as the drive communication signal Sig2 to the driver IC 4A via the drive communication terminal 4B9.

The status register 63 of the driver IC 4B is a two-bit register that is readable from the host CPU 10.

The lower bit of the status register 63 of the driver IC 4B is set to "1" when the output signal from the input reception circuit 61 is a high-level signal, and is set to "0" when the output signal from the input reception circuit 61 is a low-level signal.

The upper bit of the status register 63 of the driver IC 4B is set to "1" when the output signal from the second AND gate circuit A2 is a high-level signal, and is set to "0" when the output signal from the second AND gate circuit A2 is a low-level signal.

Thus, the host CPU 10 can obtain the status of the output signal from the input reception circuit 61 by reading the status register 63 of the driver IC 4B and referring to the lower bit thereof.

This configuration enables the host CPU 10 to determine whether the drive start signal or the drive stop signal has been received by the input reception circuit 61 of the driver IC 4B.

The host CPU 10 can obtain the status of the output signal from the second AND gate circuit A2 by reading the status register 63 of the driver IC 4B and referring to the upper bit thereof.

This configuration enables the host CPU 10 to determine whether the drive signal output circuit 53 of the driver IC 4B is controlled by the output controller 52 to output the drive signals.

Figure 5:
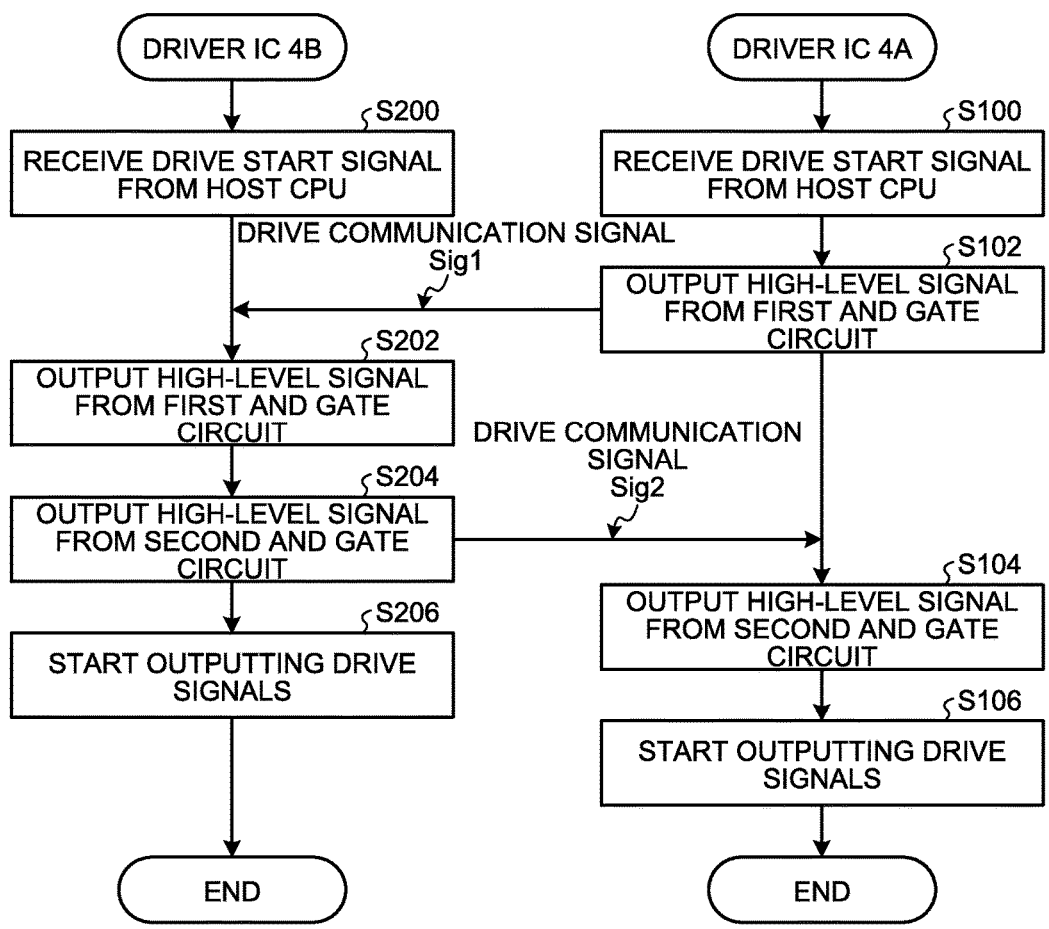
FIG. 5 is a flowchart illustrating an operation of the driver ICs of the display apparatus according to the first embodiment.

FIG. 5 is a flowchart illustrating an operation of the driver ICs of the display apparatus according to the first embodiment. The flowchart in FIG. 5 illustrates the operation of the driver ICs 4A and 4B to start outputting the drive signals.

To start outputting the drive signals, the host CPU 10 outputs a drive start signal to the driver ICs 4A and 4B.

At Step S100, the input reception circuit 61 of the driver IC 4A receives the drive start signal from the host CPU 10, and outputs a high-level signal to the first input terminal of the first AND gate circuit A1 and to the second input terminal of the second AND gate circuit A2.

At Step S200, the input reception circuit 61 of the driver IC 4B receives the drive start signal from the host CPU 10, and outputs a high-level signal to the first input terminal of the first AND gate circuit A1 and to the second input terminal of the second AND gate circuit A2.

The first AND gate circuit A1 of the driver IC 4A, which has received the high-level signal from the input reception circuit 61 through the first input terminal at Step S100, outputs a high-level signal to the third input terminal of the second AND gate circuit A2 at Step S102. The first AND gate circuit A1 of the driver IC 4A also outputs a high-level drive communication signal Sig1 to the driver IC 4B.

The first AND gate circuit A1 of the driver IC 4B, which has received the high-level drive communication signal Sig1 from the driver IC 4A through the second input terminal at Step S102, outputs a high-level signal to the third input terminal of the second AND gate circuit A2 at Step S202.

The second AND gate circuit A2 of the driver IC 4B, which has received the high-level signal from the first AND gate circuit A1 through the third input terminal at Step S202, outputs a high-level signal to the drive signal output circuit 53 at Step S204. The second AND gate circuit A2 of the driver IC 4B also outputs a high-level drive communication signal Sig2 to the driver IC 4A.

The drive signal output circuit 53 of the driver IC 4B, which has received the high-level signal from the second AND gate circuit A2 at Step S204, starts outputting the drive signals at Step S206.

The second AND gate circuit A2 of the driver IC 4A, which has received the high-level drive communication signal Sig2 from the driver IC 4B through the first input terminal at Step S204, outputs a high-level signal to the drive signal output circuit 53 at Step S104.

The drive signal output circuit 53 of the driver IC 4A, which has received the high-level signal from the second AND gate circuit A2 at Step S104, starts outputting the drive signals at Step S106.

As described above, the driver IC 4A outputs a high-level drive communication signal Sig1 to the driver IC 4B when the input reception circuit 61 receives a drive start signal from the host CPU 10. The driver IC 4B starts outputting the drive signals when the input reception circuit 61 receives the drive start signal from the host CPU 10 and when the high-level drive communication signal Sig1 is input from the driver IC 4A. The driver IC 4A starts outputting the drive signals when receiving a high-level drive communication signal Sig2 from the driver IC 4B.

Thus, the driver ICs 4A and 4B start outputting the drive signals only when both of the driver ICs 4A and 4B receive the drive start signal from the host CPU 10 and when neither the driver IC 4A nor 4B is inoperative.

In other words, the driver ICs 4A and 4B do not start outputting the drive signals when only one of the driver ICs 4A and 4B receives the drive start signal from the host CPU 10.

The driver ICs 4A and 4B do not start outputting the drive signals when one of or both of the driver ICs 4A and 4B are inoperative.

This configuration can prevent a case in which only the driver IC 4A starts outputting the drive signals while the driver IC 4B does not, and a case in which only the driver IC 4B starts outputting the drive signals while the driver IC 4A does not. This configuration can prevent overcurrent between the driver ICs 4A and 4B. Thus, the driver ICs 4A and 4B can prevent the display apparatus 1 from being affected by the overcurrent.

The host CPU 10 can obtain the internal state of the output controller 52 of the driver IC 4A by reading the status register 63 of the driver IC 4A and can obtain the internal state of the output controller 52 of the driver IC 4B by reading the status register 63 of the driver IC 4B.

This configuration allows users to easily find a cause when the driver ICs 4A and 4B do not start outputting the drive signals.

The driver ICs 4A and 4B have the same inner configuration. This configuration eliminates the need for preparing different types of components for the driver ICs 4A and 4B, and thus can reduce production costs.

Figure 6:
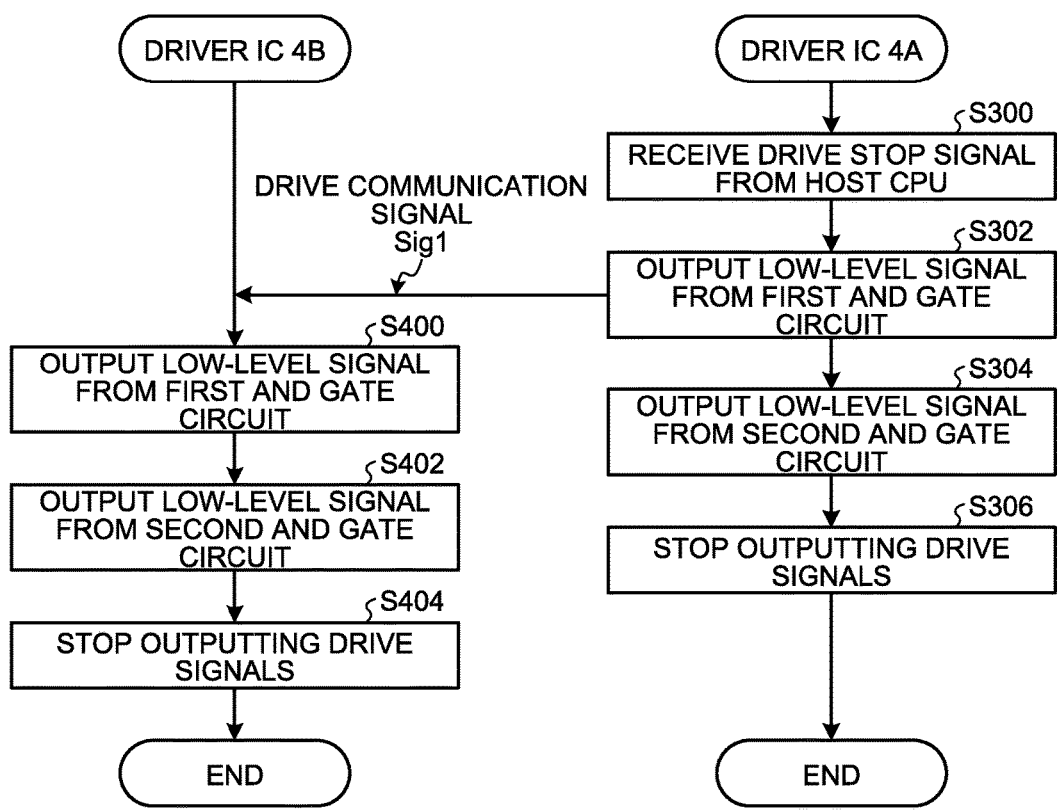
FIG. 6 is a flowchart illustrating another operation of the driver ICs of the display apparatus according to the first embodiment.

FIG. 6 is a flowchart illustrating another operation of the driver ICs of the display apparatus according to the first embodiment. The flowchart in FIG. 6 illustrates the operation of the driver ICs 4A and 4B in stopping outputting the drive signals.

To stop outputting the drive signal, the host CPU 10 outputs a drive stop signal to the driver IC 4A or 4B. The flowchart in FIG. 6 illustrates the operation of the driver ICs 4A and 4B when the host CPU 10 outputs the drive stop signal to the driver IC 4A.

At Step S300, the input reception circuit 61 of the driver IC 4A receives the drive stop signal from the host CPU 10, and outputs a low-level signal to the first input terminal of the first AND gate circuit A1 and to the second input terminal of the second AND gate circuit A2.

The first AND gate circuit A1 of the driver IC 4A, which has received the low-level signal from the input reception circuit 61 through the first input terminal at Step S300, outputs a low-level signal to the third input terminal of the second AND gate circuit A2 at Step S302. The first AND gate circuit A1 of the driver IC 4A also outputs a low-level drive communication signal Sig1 to the driver IC 4B.

The second AND gate circuit A2 of the driver IC 4A, which has received the low-level signal from the input reception circuit 61 through the second input terminal at Step S300, outputs a low-level signal to the drive signal output circuit 53 at Step S304.

The drive signal output circuit 53 of the driver IC 4A, which has received the low-level signal from the second AND gate circuit A2 at Step S304, stops outputting the drive signals at Step S306.

The first AND gate circuit A1 of the driver IC 4B, which has received the low-level drive communication signal Sig1 from the driver IC 4A through the second input terminal at Step S302, outputs a low-level signal to the third input terminal of the second AND gate circuit A2 at Step S400.

The second AND gate circuit A2 of the driver IC 4B, which has received the low-level signal from the first AND gate circuit A1 through the third input terminal at Step S400, outputs a low-level signal to the drive signal output circuit 53 at Step S402.

The drive signal output circuit 53 of the driver IC 4B, which has received the low-level signal from the second AND gate circuit A2 at Step S402, stops outputting the drive signals at Step S404.

As described above, the driver IC 4A stops outputting the drive signals when the input reception circuit 61 receives a drive stop signal from the host CPU 10. The driver IC 4B stops outputting the drive signals when receiving a low-level drive communication signal Sig1 from the driver IC 4A.

Thus, the driver ICs 4A and 4B stop outputting the drive signals when the driver IC 4A receives a drive stop signal from the host CPU 10.

This configuration can prevent a case in which only the driver IC 4A stops outputting the drive signals while the driver IC 4B continues to output the drive signals. This configuration can prevent overcurrent between the driver ICs 4A and 4B. Thus, the driver ICs 4A and 4B can prevent the display apparatus 1 from being affected by the overcurrent.

Figure 7:
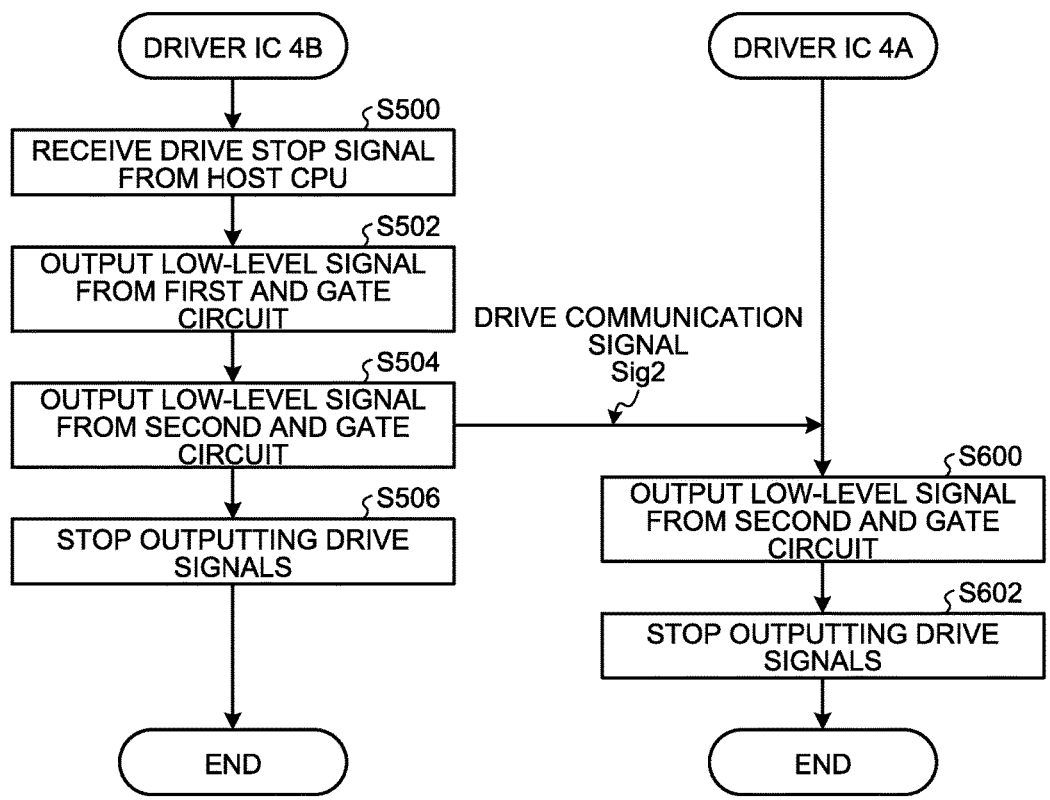
FIG. 7 is a flowchart illustrating still another operation of the driver ICs of the display apparatus according to the first embodiment.

FIG. 7 is a flowchart illustrating still another operation of the driver ICs of the display apparatus according to the first embodiment. The flowchart in FIG. 7 illustrates the operation of the driver ICs 4A and 4B when stopping outputting the drive signals.

To stop outputting the drive signals, the host CPU 10 outputs a drive stop signal to the driver IC 4A or 4B. The flowchart in FIG. 7 illustrates the operation of the driver ICs 4A and 4B when the host CPU 10 outputs the drive stop signal to the driver IC 4B.

At Step S500, the input reception circuit 61 of the driver IC 4B receives the drive stop signal from the host CPU 10, and outputs a low-level signal to the first input terminal of the first AND gate circuit A1 and to the second input terminal of the second AND gate circuit A2.

The first AND gate circuit A1 of the driver IC 4B, which has received the low-level signal from the input reception circuit 61 through the first input terminal at Step S500, outputs a low-level signal to the third input terminal of the second AND gate circuit A2 at Step S502.

The second AND gate circuit A2 of the driver IC 4B, which has received the low-level signal from the input reception circuit 61 through the second input terminal at Step S500, outputs a low-level signal to the drive signal output circuit 53 at Step S504. The second AND gate circuit A2 of the driver IC 4B also outputs a low-level drive communication signal Sig2 to the driver IC 4A.

The drive signal output circuit 53 of the driver IC 4B, which has received the low-level signal from the second AND gate circuit A2 at Step S504, stops outputting the drive signals at Step S506.

The second AND gate circuit A2 of the driver IC 4A, which has received the low-level drive communication signal Sig2 from the driver IC 4B through the second input terminal at Step S504, outputs a low-level signal to the drive signal output circuit 53 at Step S600.

The drive signal output circuit 53 of the driver IC 4A, which has received the low-level signal from the second AND gate circuit A2 at Step S600, stops outputting the drive signals at Step S602.

As described above, the driver IC 4B stops outputting the drive signals when the input reception circuit 61 receives a drive stop signal from the host CPU 10. The driver IC 4A stops outputting the drive signals when receiving a low-level drive communication signal Sig2 from the driver IC 4B.

Thus, the driver ICs 4A and 4B stop outputting the drive signals when the driver IC 4B receives a drive stop signal from the host CPU 10.

This configuration can prevent a case in which only the driver IC 4B stops outputting the drive signals while the driver IC 4A continues to output the drive signals. This configuration can prevent overcurrent between the driver ICs 4A and 4B. Thus, the driver ICs 4A and 4B can prevent the display apparatus 1 from being affected by the overcurrent.

Second Embodiment

In the first embodiment, two driver ICs 4A and 4B are included in the display apparatus 1, but the number of the driver ICs is not limited to two. In a second embodiment of the present invention, four driver ICs are included in a display apparatus. In the second embodiment and subsequent embodiments, description of components that are the same as those in the first embodiment may be omitted as appropriate.

Figure 8:
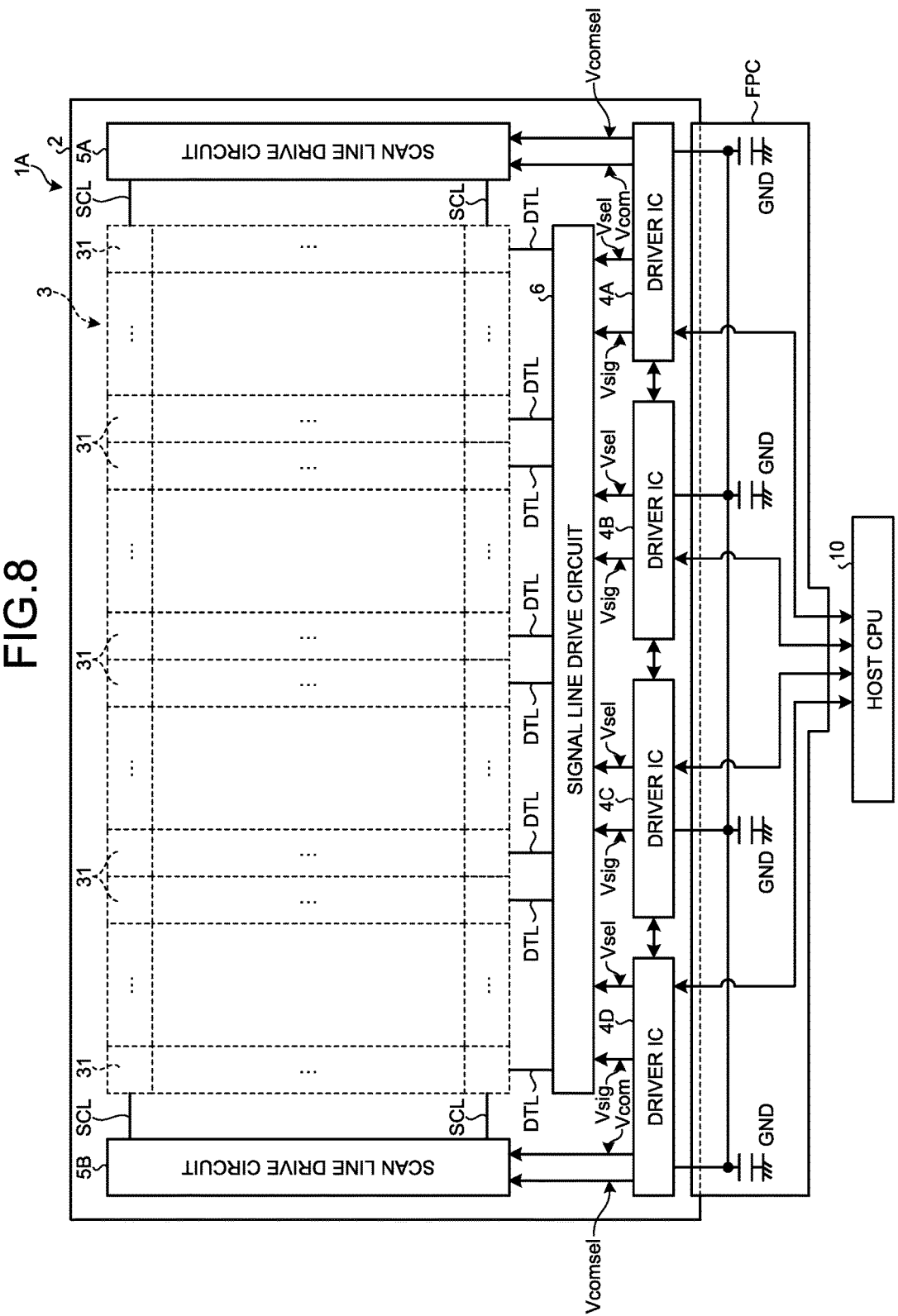
FIG. 8 is a block diagram illustrating an example of a configuration of a display apparatus according to a second embodiment of the present invention.

FIG. 8 is a block diagram illustrating an example of a configuration of a display apparatus according to the second embodiment.

As illustrated in FIG. 8, the display apparatus 1A includes driver ICs 4A, 4B, 4C, and 4D that output drive signals for driving the pixel group 3.

The driver IC 4D drives M×j pixels 31 in the first to j-th columns (j is a natural number where $1 \leq j < (N-2)$ is satisfied).

The driver IC 4C drives M×(k−j) pixels 31 in the (j+1)-th to k-th columns (k is a natural number where $j < k < (N-1)$ is satisfied).

The driver IC 4B drives M×(l−k) pixels 31 in the (k+1)-th to l-th columns (l is a natural number where $k < l < N$ is satisfied).

The driver IC 4A drives M×(N−l) pixels 31 in the (l+1)-th to N-th columns.

This configuration allows the pixel group 3 of the display apparatus 1A to display a high-resolution image even when the driver ICs 4A, 4B, 4C, and 4D, which are semiconductor apparatuses, have a limited number of terminals.

The driver IC 4A outputs, to the scan line drive circuit 5A, a scan signal Vcom having a potential to be applied to a scan line SCL. The driver IC 4A outputs, to the scan line drive circuit 5A, a drive selection signal Vcomsel for selecting a scan line SCL to which the scan signal Vcom is applied.

The scan line drive circuit 5A is a shift register that applies the scan signal Vcom to a scan line SCL in a row selected by the drive selection signal Vcomsel.

The driver IC 4D outputs, to the scan line drive circuit 5B, a scan signal Vcom having a potential to be applied to a scan line SCL. The driver IC 4D outputs, to the scan line drive circuit 5B, a drive selection signal Vcomsel for selecting a scan line SCL to which the scan signal Vcom is applied.

The scan line drive circuit 5B is a shift register that applies the scan signal Vcom to a scan line SCL in a row selected by the drive selection signal Vcomsel.

The driver ICs 4A and 4D each output a drive selection signal Vcomsel for selecting the same scan line SCL in the same row to the scan line drive circuits 5A and 5B, respectively. Thus, the scan line drive circuits 5A and 5B output the scan signals Vcom to the respective ends of the same scan line SCL in the same row at substantially the same time.

The driver ICs 4A and 4D may each output a drive selection signal Vcomsel for selecting a different scan line SCL in a different row to the scan line drive circuits 5A and 5B, respectively. For example, the scan line drive circuit 5A may be configured to control scan lines SCL in odd-numbered rows, and the scan line drive circuit 5B may be configured to control scan lines SCL in even-numbered rows.

This configuration enables the display apparatus 1A to appropriately drive the signal lines SCL even when many pixels are aligned in each column or the scan lines SCL have a large parasitic capacitance.

The driver IC 4A outputs image signals Vsig to be applied to a plurality of pixels 31 in the (l+1)-th to N-th columns of a row selected by the scan signal Vcom to the signal line drive circuit 6. The image signals to be applied to the pixels 31 each include four sub-image signals that are time-division multiplexed and are applied to the four subpixels included in each pixel 31.

This configuration can reduce the number of lines of wiring between the driver IC 4A and the signal line drive circuit 6 in the display apparatus 1A.

The driver IC 4A outputs an image selection signal Vsel that indicates the timing at which the four sub-image signals are time-division multiplexed to the signal line drive circuit 6.

The signal line drive circuit 6 is a selector that separates the four sub-image signals that are time-division multiplexed from one another in accordance with the image selection signal Vsel and applies the separated sub-image signals to the respective subpixels via the image signal lines DTL.

The driver IC 4B outputs image signals Vsig to be applied to a plurality of pixels 31 in the (k+1)-th to l-th columns of a row selected by the scan signal Vcom to the signal line drive circuit 6. The image signals to be applied to the pixels 31 each include four sub-image signals that are time-division multiplexed and are applied to the four subpixels includes in each pixel 31.

This configuration can reduce the number of lines of wiring between the driver IC 4B and the signal line drive circuit 6 in the display apparatus 1A.

The driver IC 4B outputs an image selection signal Vsel that indicates the timing at which the four sub-image signals are time-division multiplexed to the signal line drive circuit 6.

The driver IC 4C outputs image signals Vsig to be applied to a plurality of pixels 31 in the (j+1)-th to k-th columns of a row selected by the scan signal Vcom to the signal line drive circuit 6. The image signals to be applied to the pixels 31 each include four sub-image signals that are time-division multiplexed and are applied to the four subpixels included in each pixel 31.

This configuration can reduce the number of lines of wiring between the driver IC 4C and the signal line drive circuit 6 in the display apparatus 1A.

The driver IC 4C outputs an image selection signal Vsel that indicates the timing at which the four sub-image signals are time-division multiplexed to the signal line drive circuit 6.

The driver IC 4D outputs image signals Vsig to be applied to a plurality of pixels 31 in the first to j-th columns of a row selected by the scan signal Vcom to the signal line drive circuit 6. The image signals to be applied to the pixels 31 each include four sub-image signals that are time-division multiplexed and are applied to the four subpixels included in each pixel 31.

This configuration can reduce the number of lines of wiring between the driver IC 4D and the signal line drive circuit 6 in the display apparatus 1A.

The driver IC 4D outputs an image selection signal Vsel that indicates the timing at which the four sub-image signals are time-division multiplexed to the signal line drive circuit 6.

Figure 9:
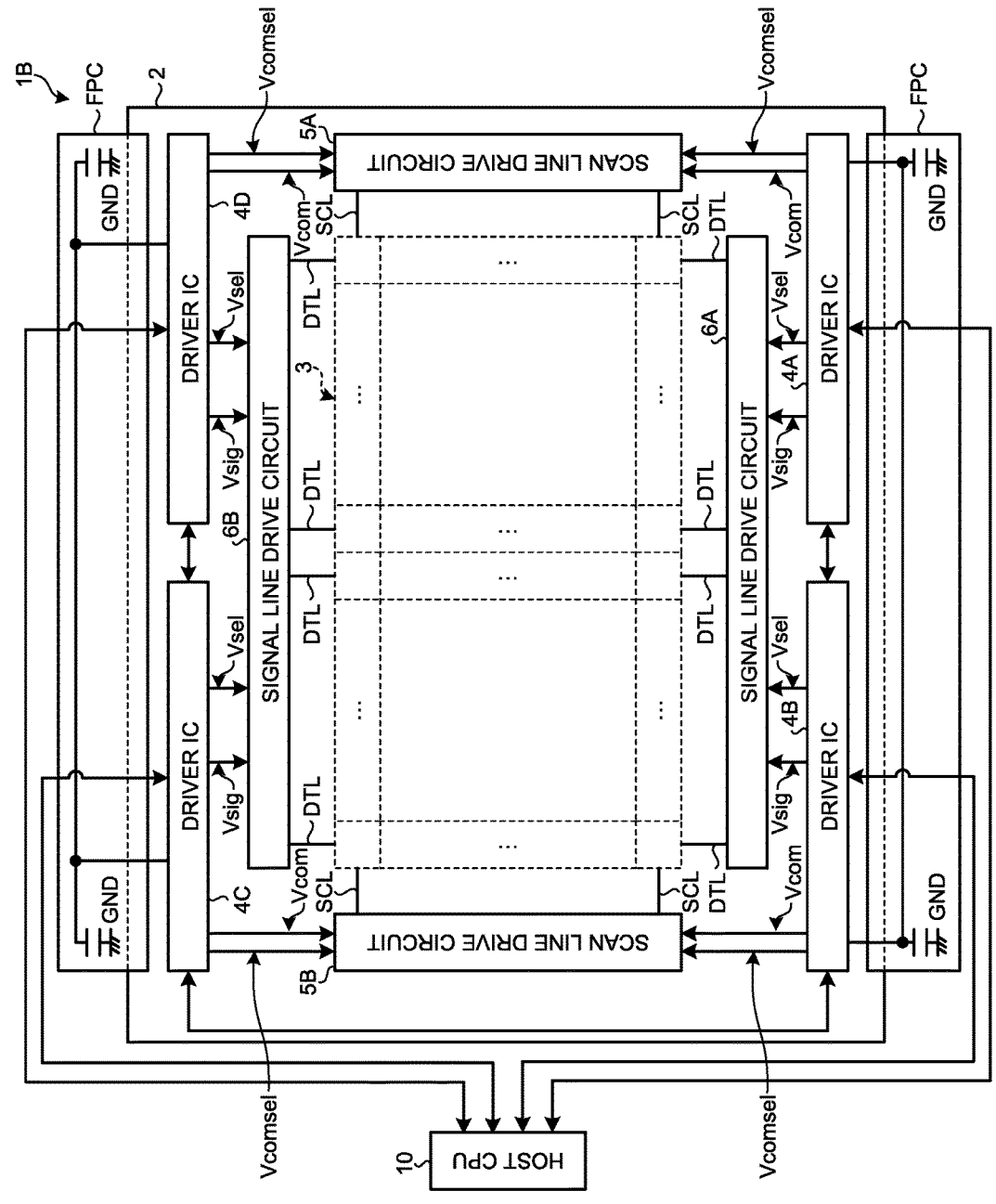
FIG. 9 is a block diagram illustrating another example of the configuration of the display apparatus according to the second embodiment.

FIG. 9 is a block diagram illustrating another example of the configuration of the display apparatus according to the second embodiment.

As illustrated in FIG. 9, the display apparatus 1B includes the driver ICs 4A, 4B, 4C, and 4D that output drive signals for driving the pixel group 3.

The driver ICs 4B and 4C drive M×m pixels 31 in the first to m-th columns (m is a natural number where 1≤m<N is satisfied).

The driver ICs 4A and 4D drive M×(N−m) pixels 31 in the (m+1)-th to N-th columns.

This configuration allows the pixel group 3 of the display apparatus 1B to display a high-resolution image even when the driver ICs 4A, 4B, 4C, and 4D, which are semiconductor apparatuses, have a limited number of terminals.

The driver IC 4A outputs, to the scan line drive circuit 5A, a scan signal Vcom having a potential to be applied to a scan line SCL. The driver IC 4A outputs, to the scan line drive circuit 5A, a drive selection signal Vcomsel for selecting a scan line SCL to which the scan signal Vcom is applied.

The driver IC 4D outputs, to the scan line drive circuit 5A, a scan signal Vcom having a potential to be applied to a scan line SCL. The driver IC 4D outputs, to the scan line drive circuit 5A, a drive selection signal Vcomsel for selecting a scan line SCL to which the scan signal Vcom is applied.

The scan line drive circuit 5A is a shift register that applies the scan signal Vcom to a scan line SCL in a row selected by the drive selection signal Vcomsel.

The driver IC 4B outputs, to the scan line drive circuit 5B, a scan signal Vcom having a potential to be applied to a scan line SCL. The driver IC 4B outputs, to the scan line drive circuit 5B, a drive selection signal Vcomsel for selecting a scan line SCL to which the scan signal Vcom is applied.

The driver IC 4C outputs, to the scan line drive circuit 5B, a scan signal Vcom having a potential to be applied to a scan line SCL. The driver IC 4C outputs, to the scan line drive circuit 5B, a drive selection signal Vcomsel for selecting a scan line SCL to which the scan signal Vcom is applied.

The scan line drive circuit 5B is a shift register that applies the scan signal Vcom to a scan line SCL in a row selected by the drive selection signal Vcomsel.

The driver ICs 4A, 4B, 4C, and 4D each output a drive selection signal Vcomsel for selecting the same scan line SCL in the same row to the scan line drive circuits 5A and 5B. Thus, the scan line drive circuits 5A and 5B output the scan signals Vcom to the respective ends of the same scan line SCL in the same row at substantially the same time.

The driver ICs 4A, 4B, 4C, and 4D may each output a drive selection signal Vcomsel for selecting a different scan line SCL in a different row to the scan line drive circuits 5A and 5B. For example, the scan line drive circuit 5A may be configured to control scan lines SCL in odd-numbered rows, and the scan line drive circuit 5B may be configured to control scan lines SCL in even-numbered rows.

This configuration enables the display apparatus 1B to appropriately drive the signal lines SCL even when many pixels are aligned in each column or the scan lines SCL have a large parasitic capacitance.

The driver IC 4A outputs image signals Vsig to be applied to a plurality of pixels 31 in the (m+1)-th to N-th columns of a row selected by the scan signal Vcom to a signal line drive circuit 6A. The image signals to be applied to the pixels 31 each include four sub-image signals that are time-division multiplexed and are applied to the four subpixels included in each pixel 31.

This configuration can reduce the number of lines of wiring between the driver IC 4A and the signal line drive circuit 6A in the display apparatus 1B.

The driver IC 4A outputs an image selection signal Vsel that indicates the timing at which the four sub-image signals are time-division multiplexed to the signal line drive circuit 6A.

The signal line drive circuit 6A is a selector that separates the four sub-image signals that are time-division multiplexed from one another in accordance with the image selection signal Vsel and applies the separated sub-image signals to the respective subpixels via the image signal lines DTL.

The driver IC 4D outputs image signals Vsig to be applied to a plurality of pixels 31 in the (m+1)-th to N-th columns of a row selected by the scan signal Vcom to the signal line drive circuit 6B. The image signals to be applied to the pixels 31 each include four sub-image signals that are time-division multiplexed and are applied to the four subpixels included in each pixel 31.

This configuration can reduce the number of lines of wiring between the driver IC 4D and the signal line drive circuit 6B in the display apparatus 1B.

The driver IC 4D outputs an image selection signal Vsel that indicates the timing at which the four sub-image signals are time-division multiplexed to the signal line drive circuit 6B.

The driver ICs 4A and 4D output the same image signals to the signal line drive circuits 6A and 6B, respectively. Thus, the signal line drive circuits 6A and 6B output the image signals to the respective ends of the same image signal line DTL in the same column at substantially the same time.

The driver ICs 4A and 4D may each output an image signal to a different image signal line DTL in a different column. For example, the driver IC 4A may output image signals to image signal lines DTL in odd-numbered columns, and the driver IC 4D may output image signals to image signal lines DTL in even-numbered columns.

This configuration enables the display apparatus 1B to appropriately drive the image signal lines DTL even when many pixels are aligned in each row or the image signal lines DTL have a large parasitic capacitance.

The driver IC 4B outputs image signals Vsig to be applied to a plurality of pixels 31 in the first to m-th columns of a row selected by the scan signal Vcom to the signal line drive circuit 6A. The image signals to be applied to the pixels 31 each include four sub-image signals that are time-division multiplexed and are applied to the four subpixels included in each pixel 31.

This configuration can reduce the number of lines of wiring between the driver IC 4B and the signal line drive circuit 6A in the display apparatus 1B.

The driver IC 4B outputs an image selection signal Vsel that indicates the timing at which the four sub-image signals are time-division multiplexed to the signal line drive circuit 6A.

The driver IC 4C outputs image signals Vsig to be applied to a plurality of pixels 31 in the first to m-th columns of a row selected by the scan signal Vcom to the signal line drive circuit 6B. The image signals to be applied to the pixels 31 each include four sub-image signals that are time-division multiplexed and are applied to the four subpixels included in each pixel 31.

This configuration can reduce the number of lines of wiring between the driver IC 4C and the signal line drive circuit 6B in the display apparatus 1B.

The driver IC 4C outputs an image selection signal Vsel that indicates the timing at which the four sub-image signals are time-division multiplexed to the signal line drive circuit 6B.

The driver ICs 4B and 4C output the same image signals to the signal line drive circuits 6A and 6B, respectively. Thus, the signal line drive circuits 6A and 6B output the image signals to the respective ends of the same image signal line DTL in the same column at substantially the same time.

This configuration enables the display apparatus 1B to appropriately drive the image signal lines DTL even when many pixels are aligned in each row or the image signal lines DTL have a large parasitic capacitance.

Figure 10:
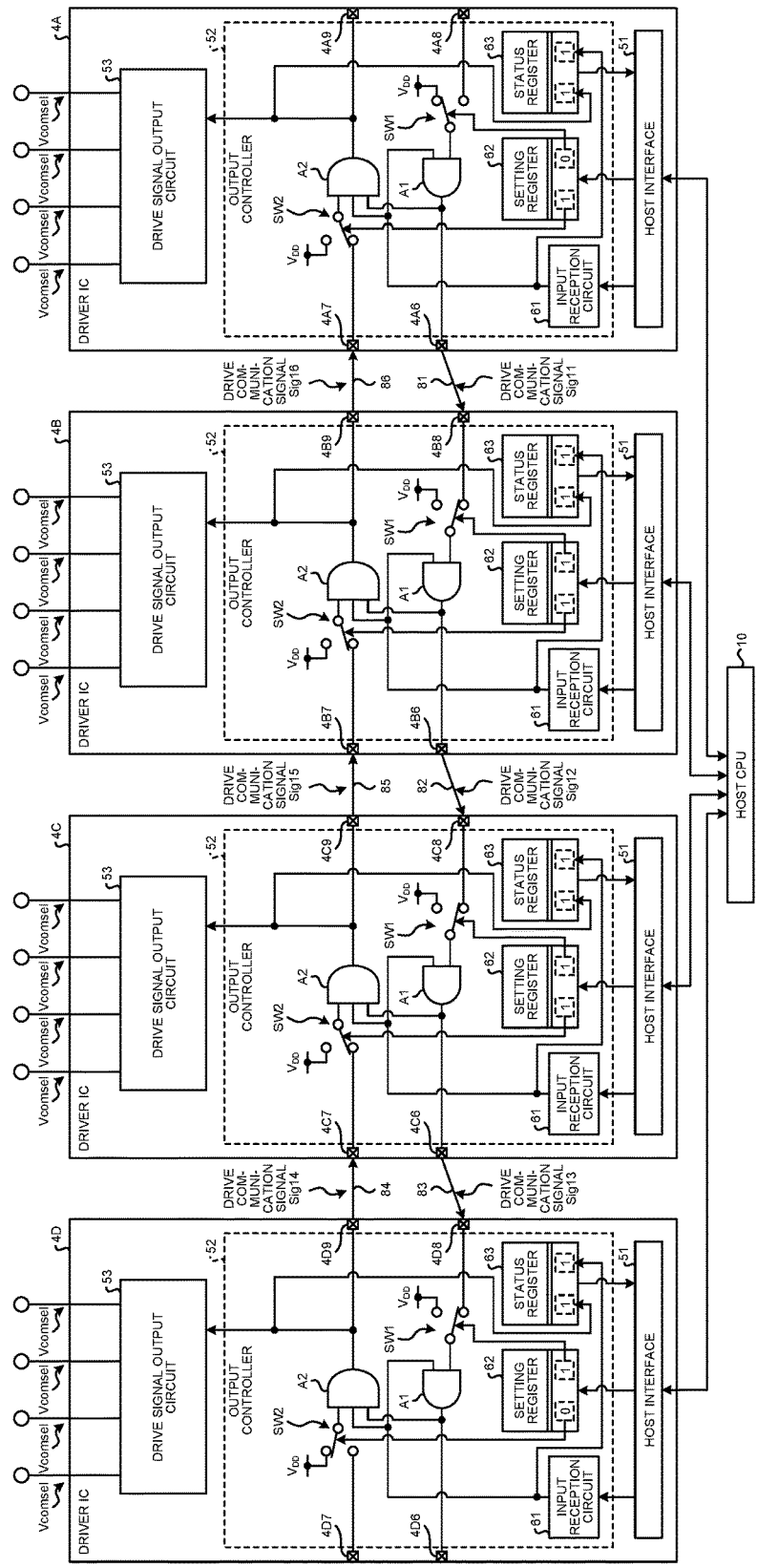
FIG. 10 is a diagram illustrating an inner configuration of driver ICs of the display apparatus according to the second embodiment.

FIG. 10 is a diagram illustrating an inner configuration of the driver ICs of the display apparatus according to the second embodiment. When the driver ICs are configured as illustrated in FIG. 8, the driver ICs 4B and 4C are configured not to output the scan signal Vcom.

The driver ICs 4A, 4B, 4C, and 4D have the same inner configuration. This configuration eliminates the need for preparing different types of components for the driver ICs 4A, 4B, 4C, and 4D, and thus can reduce production costs.

The driver ICs 4A, 4B, 4C, and 4D are electrically coupled to one another. Specifically, the driver ICs 4A, 4B, 4C, and 4D are coupled to one another in series via first wiring 81 to 83 in the first direction. The driver ICs 4A, 4B, 4C, and 4D are coupled to one another in series via second wiring 84 to 86 in the second direction opposite to the first direction. The first wiring 81 to 83 are each coupled to the first AND gate circuit, and the second wiring 84 to 86 are each coupled to the second AND gate circuit. In other words, the driver ICs 4A, 4B, 4C, and 4D are electrically coupled to one another in a daisy chain arrangement. In other words, the driver IC 4A is a first end semiconductor apparatus arranged at one end of the semiconductor apparatuses coupled via the first wiring or the second wiring. Each of the driver IC 4B and the driver IC 4C is an intermediate semiconductor apparatus arranged between the ends of the semiconductor apparatuses coupled via the first wiring or the second wiring. The driver IC 4D is a second end semiconductor apparatus arranged at the other end of the semiconductor apparatuses coupled via the first wiring or the second wiring.

The driver ICs 4A, 4B, 4C, and 4D output and receive, to and from one another, a drive communication signal indicating reception of the drive start signal to start driving the pixels 31. When all the driver ICs 4A, 4B, 4C, and 4D receive the drive communication signal indicating that all the driver ICs have received the drive start signal, the driver ICs 4A, 4B, 4C, and 4D start outputting the drive signals.

In the second embodiment, the lower bit of the setting register 62 of the driver IC 4A is set to "0" by the host CPU 10. Thus, the second input terminal of the first AND gate circuit A1 of the driver IC 4A receives the power supply potential $V_{DD}$ at the higher voltage level.

The output signal from the first AND gate circuit A1 of the driver IC 4A is a high-level signal when the input reception circuit 61 of the driver IC 4A receives the drive start signal from the host CPU 10, whereas the output signal is a low-level signal when the input reception circuit 61 of the driver IC 4A receives the drive stop signal from the host CPU 10.

The first AND gate circuit A1 of the driver IC 4A outputs the output signal to the third input terminal of the second AND gate circuit A2.

The first AND gate circuit A1 of the driver IC 4A outputs the output signal as a drive communication signal Sig11 to the driver IC 4B via the drive communication terminal 4A6.

In the second embodiment, the upper bit of the setting register 62 of the driver IC 4A is set to "1" by the host CPU 10. Thus, the first input terminal of the second AND gate circuit A2 of the driver IC 4A receives a drive communication signal Sig16 input to the drive communication terminal 4A7 from the driver IC 4B.

The output signal from the second AND gate circuit A2 of the driver IC 4A is a high-level signal when the input reception circuit 61 of the driver IC 4A receives the drive start signal from the host CPU 10 and when the drive communication signal Sig16 is a high-level signal. The second AND gate circuit A2 of the driver IC 4A outputs a high-level output signal to the drive signal output circuit 53. This high-level signal causes the drive signal output circuit 53 of the driver IC 4A to start outputting the drive signals.

The output signal from the second AND gate circuit A2 of the driver IC 4A is a low-level signal when the input reception circuit 61 of the driver IC 4A receives the drive stop signal from the host CPU 10 or when the drive communication signal Sig16 is a low-level signal. The second AND gate circuit A2 of the driver IC 4A outputs a low-level output signal to the drive signal output circuit 53. This low-level signal causes the drive signal output circuit 53 of the driver IC 4A to stop outputting the drive signals.

In the second embodiment, the lower bit of the setting register 62 of the driver IC 4B is set to "1" by the host CPU 10. Thus, the second input terminal of the first AND gate circuit A1 of the driver IC 4B receives the drive communication signal Sig11 input to the drive communication terminal 4B8 from the driver IC 4A.

The output signal from the first AND gate circuit A1 of the driver IC 4B is a high-level signal when the input reception circuit 61 of the driver IC 4B receives the drive start signal from the host CPU 10 and when the drive communication signal Sig11 is a high-level signal. The output signal from the first AND gate circuit A1 of the driver IC 4B is a low-level signal when the input reception circuit 61 of the driver IC 4B receives the drive stop signal from the host CPU 10 or when the drive communication signal Sig11 is a low-level signal.

The first AND gate circuit A1 of the driver IC 4B outputs the output signal as a drive communication signal Sig12 to the driver IC 4C via the drive communication terminal 4B6.

In the second embodiment, the upper bit of the setting register 62 of the driver IC 4B is set to "1" by the host CPU 10. Thus, the first input terminal of the second AND gate circuit A2 of the driver IC 4B receives a drive communication signal Sig15 input to the drive communication terminal 4B7 from the driver IC 4C.

The output signal from the second AND gate circuit A2 of the driver IC 4B is a high-level signal when the input reception circuit 61 of the driver IC 4B receives the drive start signal from the host CPU 10, and when the drive communication signals Sig11 and Sig15 are high-level signals. The second AND gate circuit A2 of the driver IC 4B outputs a high-level output signal to the drive signal output circuit 53. This high-level signal causes the drive signal output circuit 53 of the driver IC 4B to start outputting the drive signals.

The output signal from the second AND gate circuit A2 of the driver IC 4B is a low-level signal when the input reception circuit 61 of the driver IC 4B receives at least one of the drive stop signal from the host CPU 10, a low-level drive communication signal Sign, and a low-level drive communication signal Sig15. The second AND gate circuit A2 of the driver IC 4B outputs a low-level output signal to the drive signal output circuit 53. This low-level signal causes the drive signal output circuit 53 of the driver IC 4B to stop outputting the drive signals.

The second AND gate circuit A2 of the driver IC 4B outputs the output signal as the drive communication signal Sig16 to the driver IC 4A via the drive communication terminal 4B9.

In the second embodiment, the lower bit of the setting register 62 of the driver IC 4C is set to "1" by the host CPU 10. Thus, the second input terminal of the first AND gate circuit A1 of the driver IC 4C receives the drive communication signal Sig12 input to a drive communication terminal 4C8 from the driver IC 4B.

The output signal from the first AND gate circuit A1 of the driver IC 4C is a high-level signal when the input reception circuit 61 of the driver IC 4C receives the drive start signal from the host CPU 10 and when the drive communication signal Sig12 is a high-level signal. The output signal from the first AND gate circuit A1 of the driver IC 4C is a low-level signal when the input reception circuit 61 of the driver IC 4C receives the drive stop signal from the host CPU 10 or when the drive communication signal Sig12 is a low-level signal.

The first AND gate circuit A1 of the driver IC 4C outputs the output signal as a drive communication signal Sig13 to the driver IC 4D via a drive communication terminal 4C6.

In the second embodiment, the upper bit of the setting register 62 of the driver IC 4C is set to "1" by the host CPU 10. Thus, the first input terminal of the second AND gate circuit A2 of the driver IC 4C receives a drive communication signal Sig14 input to a drive communication terminal 4C7 from the driver IC 4D.

The output signal from the second AND gate circuit A2 of the driver IC 4C is a high-level signal when the input reception circuit 61 of the driver IC 4C receives the drive start signal from the host CPU 10 and when the drive communication signals Sig12 and Sig14 are high-level signals. The second AND gate circuit A2 of the driver IC 4C outputs a high-level output signal to the drive signal output circuit 53. This high-level signal causes the drive signal output circuit 53 of the driver IC 4C to start outputting the drive signals.

The output signal from the second AND gate circuit A2 of the driver IC 4C is a low-level signal when the input reception circuit 61 of the driver IC 4C receives at least one of the drive stop signal from the host CPU 10, a low-level drive communication signal Sig12, and a low-level drive communication signal Sig14. The second AND gate circuit A2 of the driver IC 4C outputs a low-level output signal to the drive signal output circuit 53. This low-level signal causes the drive signal output circuit 53 of the driver IC 4C to stop outputting the drive signals.

The second AND gate circuit A2 of the driver IC 4C outputs the output signal as the drive communication signal Sig15 to the driver IC 4B via a drive communication terminal 4C9.

In the second embodiment, the lower bit of the setting register 62 of the driver IC 4D is set to "1" by the host CPU 10. Thus, the second input terminal of the first AND gate circuit A1 of the driver IC 4D receives the drive communication signal Sig13 input to a drive communication terminal 4D8 from the driver IC 4C.

The output signal from the first AND gate circuit A1 of the driver IC 4D is a high-level signal when the input reception circuit 61 of the driver IC 4D receives the drive start signal from the host CPU 10 and when the drive communication signal Sig13 is a high-level signal. The output signal from the first AND gate circuit A1 of the driver IC 4D is a low-level signal when the input reception circuit 61 of the driver IC 4D receives the drive stop signal from the host CPU 10 or when the drive communication signal Sig13 is a low-level signal.

In the second embodiment, the upper bit of the setting register 62 of the driver IC 4D is set to "0" by the host CPU 10. Thus, the first input terminal of the second AND gate circuit A2 of the driver IC 4D receives the power supply potential $V_{DD}$ at the higher voltage level.

The output signal from the second AND gate circuit A2 of the driver IC 4D is a high-level signal when the input reception circuit 61 of the driver IC 4D receives the drive start signal from the host CPU 10 and when the drive communication signal Sig13 is a high-level signal. The second AND gate circuit A2 of the driver IC 4D outputs a high-level output signal to the drive signal output circuit 53. This high-level signal causes the drive signal output circuit 53 of the driver IC 4D to start outputting the drive signals.

The output signal from the second AND gate circuit A2 of the driver IC 4D is a low-level signal when the input reception circuit 61 of the driver IC 4D receives the drive stop signal from the host CPU 10 or when the drive communication signal Sig13 is a high-level signal. The second AND gate circuit A2 of the driver IC 4D outputs a low-level output signal to the drive signal output circuit 53. This low-level signal causes the drive signal output circuit 53 of the driver IC 4D to stop outputting the drive signals.

The second AND gate circuit A2 of the driver IC 4D outputs the output signal as the drive communication signal Sig14 to the driver IC 4C via a drive communication terminal 4D9.

Figure 11:
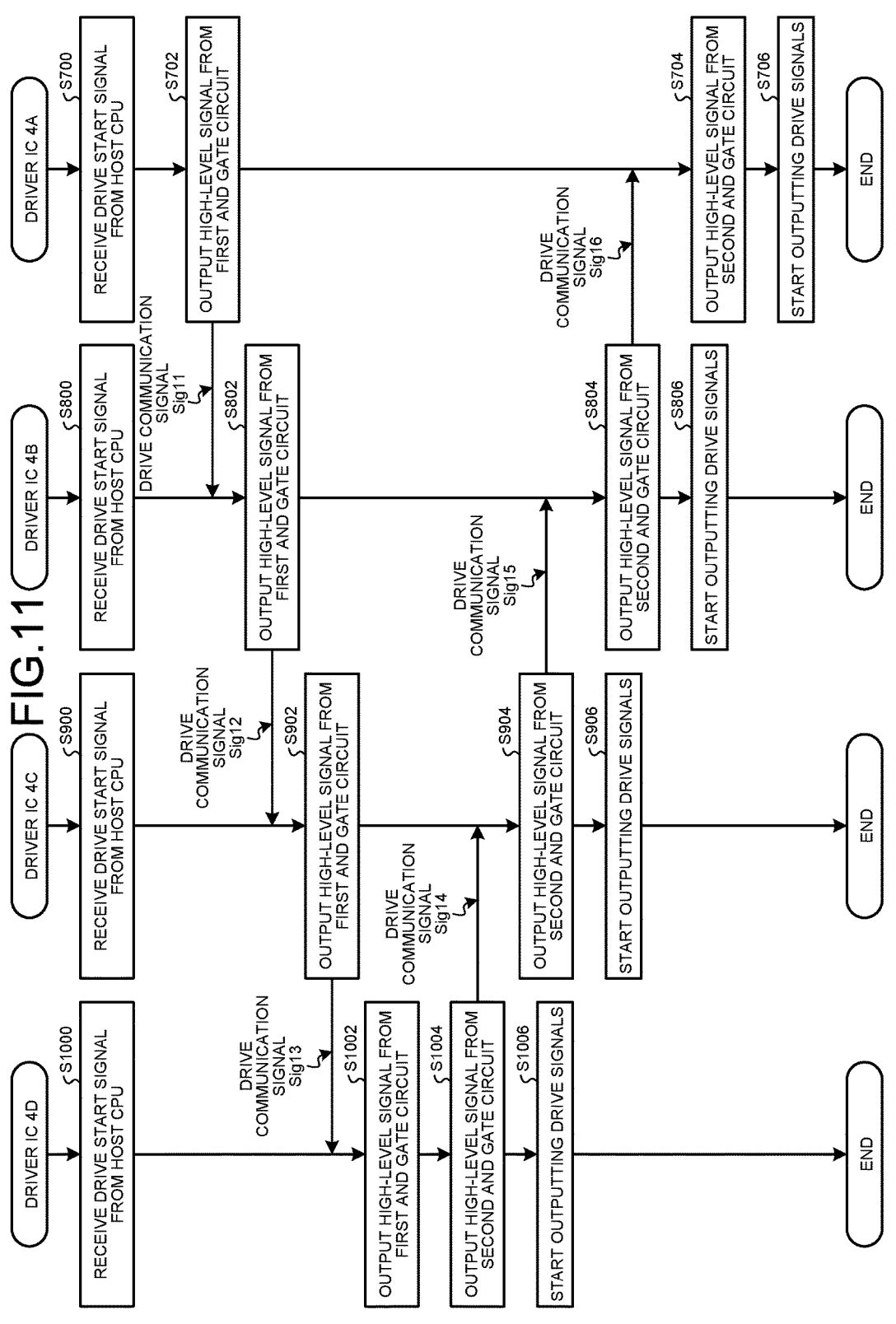

FIG. 11 is a flowchart illustrating an operation of the driver ICs of the display apparatus according to the second embodiment. The flowchart in FIG. 11 illustrates the operation of the driver ICs 4A, 4B, 4C, and 4D to start outputting the drive signals.

To start outputting the drive signals, the host CPU 10 outputs a drive start signal to the driver ICs 4A, 4B, 4C, and 4D.

At Step S700, the input reception circuit 61 of the driver IC 4A receives the drive start signal from the host CPU 10, and outputs a high-level signal to the first input terminal of the first AND gate circuit A1 and to the second input terminal of the second AND gate circuit A2.

At Step S800, the input reception circuit 61 of the driver IC 4B receives the drive start signal from the host CPU 10, and outputs a high-level signal to the first input terminal of the first AND gate circuit A1 and to the second input terminal of the second AND gate circuit A2.

At Step S900, the input reception circuit 61 of the driver IC 4C receives the drive start signal from the host CPU 10, and outputs a high-level signal to the first input terminal of the first AND gate circuit A1 and to the second input terminal of the second AND gate circuit A2.

At Step S1000, the input reception circuit 61 of the driver IC 4D receives the drive start signal from the host CPU 10, and outputs a high-level signal to the first input terminal of the first AND gate circuit A1 and to the second input terminal of the second AND gate circuit A2.

The first AND gate circuit A1 of the driver IC 4A, which has received the high-level signal from the input reception circuit 61 through the first input terminal at Step S700, outputs a high-level signal to the third input terminal of the second AND gate circuit A2 at Step S702. The first AND gate circuit A1 of the driver IC 4A also outputs a high-level drive communication signal Sig11 to the driver IC 4B.

The first AND gate circuit A1 of the driver IC 4B, which has received the high-level drive communication signal Sig11 from the driver IC 4A through the second input terminal at Step S702, outputs a high-level signal to the third input terminal of the second AND gate circuit A2 at Step S802. The first AND gate circuit A1 of the driver IC 4B also outputs a high-level drive communication signal Sig12 to the driver IC 4C.

The first AND gate circuit A1 of the driver IC 4C, which has received the high-level drive communication signal Sig12 from the driver IC 4B through the second input terminal at Step S802, outputs a high-level signal to the third input terminal of the second AND gate circuit A2 at Step S902. The first AND gate circuit A1 of the driver IC 4C also outputs a high-level drive communication signal Sig13 to the driver IC 4D.

The first AND gate circuit A1 of the driver IC 4D, which has received the high-level drive communication signal Sig13 from the driver IC 4C through the second input terminal at Step S902, outputs a high-level signal to the third input terminal of the second AND gate circuit A2 at Step S1002.

The second AND gate circuit A2 of the driver IC 4D, which has received the high-level signal from the first AND gate circuit A1 through the third input terminal at Step S1002, outputs a high-level signal to the drive signal output circuit 53 at Step S1004. The second AND gate circuit A2 of the driver IC 4D also outputs a high-level drive communication signal Sig14 to the driver IC 4C.

The drive signal output circuit 53 of the driver IC 4D, which has received the high-level signal from the second AND gate circuit A2 at Step S1004, starts outputting the drive signals at Step S1006.

The second AND gate circuit A2 of the driver IC 4C, which has received the high-level drive communication signal Sig14 from the driver IC 4D through the first input terminal at Step S1004, outputs a high-level signal to the drive signal output circuit 53 at Step S904. The second AND gate circuit A2 of the driver IC 4C also outputs a high-level drive communication signal Sig15 to the driver IC 4B.

The drive signal output circuit 53 of the driver IC 4C, which has received the high-level signal from the second AND gate circuit A2 at Step S904, starts outputting the drive signals at Step S906.

The second AND gate circuit A2 of the driver IC 4B, which has received the high-level drive communication signal Sig15 from the driver IC 4C through the first input terminal at Step S904, outputs a high-level signal to the drive signal output circuit 53 at Step S804. The second AND gate circuit A2 of the driver IC 4B also outputs a high-level drive communication signal Sig16 to the driver IC 4A.

The drive signal output circuit 53 of the driver IC 4B, which has received the high-level signal from the second AND gate circuit A2 at Step S804, starts outputting the drive signals at Step S806.

The second AND gate circuit A2 of the driver IC 4A, which has received the high-level drive communication signal Sig16 from the driver IC 4B through the first input terminal at Step S804, outputs a high-level signal to the drive signal output circuit 53 at Step S704.

The drive signal output circuit 53 of the driver IC 4A, which has received the high-level signal from the second AND gate circuit A2 at Step S704, starts outputting the drive signals at Step S706.

As described above, the driver ICs 4A, 4B, 4C, and 4D start outputting the drive signals only when all the driver ICs 4A, 4B, 4C, and 4D receive the drive start signal from the host CPU 10 and when none of the driver ICs 4A, 4B, 4C, and 4D is inoperative.

In other words, the driver ICs 4A, 4B, 4C, and 4D do not start outputting the drive signals when only one of the driver ICs 4A, 4B, 4C, and 4D receives the drive start signal from the host CPU 10.

The driver ICs 4A, 4B, 4C, and 4D do not start outputting the drive signals when any one of the driver ICs 4A, 4B, 4C, and 4D is inoperative.

This configuration can prevent a case in which only a part of the driver ICs 4A, 4B, 4C, and 4D starts outputting the drive signals while the others do not. This configuration can prevent overcurrent among the driver IC 4A, 4B, 4C, or 4D. Thus, the driver ICs 4A, 4B, 4C, and 4D can prevent the display apparatuses 1A and 1B from being affected by the overcurrent.

The driver ICs 4A, 4B, 4C, and 4D have the same inner configuration. This configuration eliminates the need for preparing different types of components for the driver ICs 4A, 4B, 4C, and 4D, and thus can reduce production costs.

Figure 12:
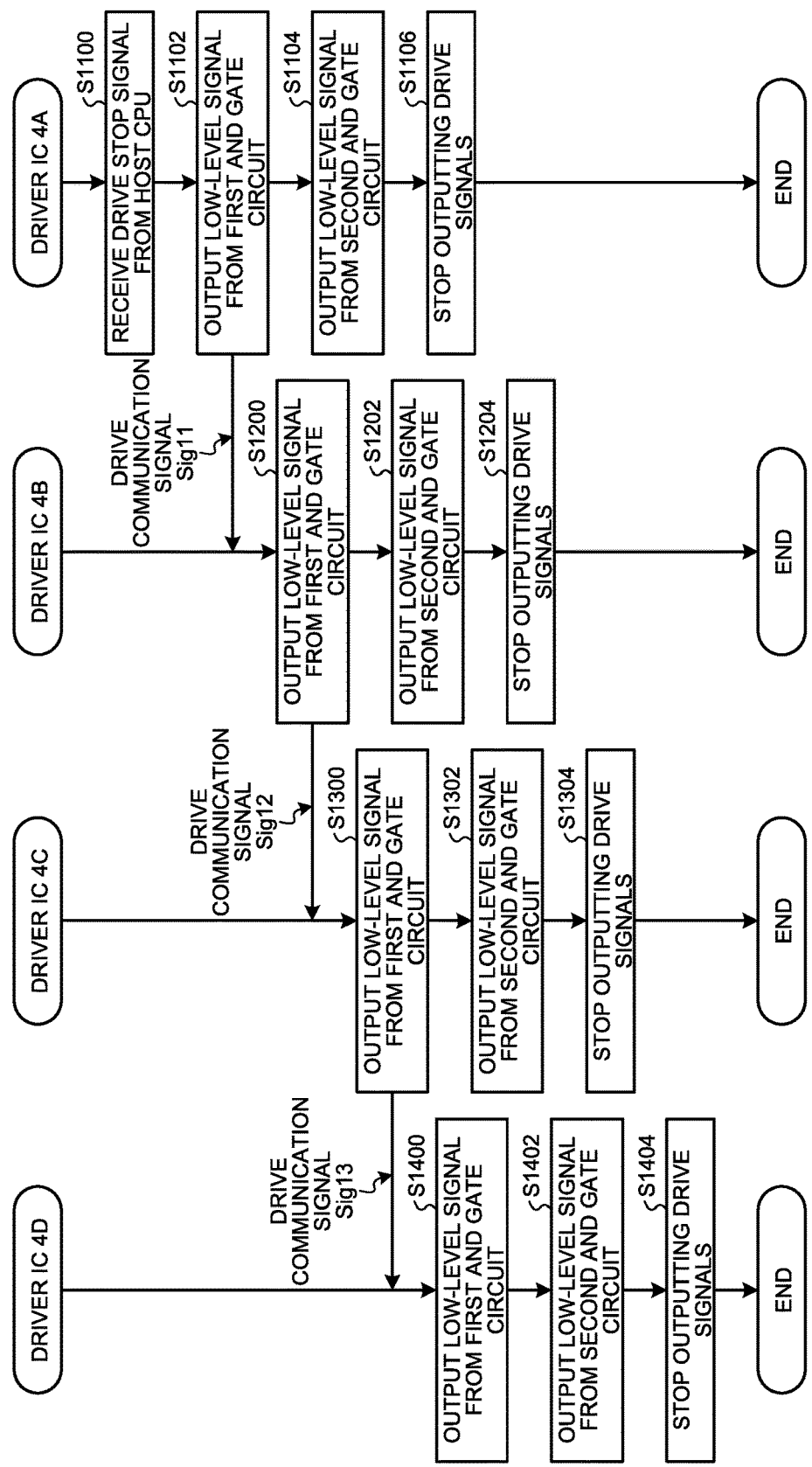
FIG. 12 is a flowchart illustrating another operation of the driver ICs of the display apparatus according to the second embodiment.

FIG. 12 is a flowchart illustrating an operation of the driver ICs of the display apparatus according to the second embodiment. The flowchart in FIG. 12 illustrates the operation of the driver ICs 4A, 4B, 4C, and 4D when stopping outputting the drive signals.

To stop outputting the drive signals, the host CPU 10 outputs a drive stop signal to the driver IC 4A, 4B, 4C, or 4D. The flowchart in FIG. 12 illustrates the operation of the driver ICs 4A, 4B, 4C, and 4D when the host CPU 10 outputs the drive stop signal to the driver IC 4A.

At Step S1100, the input reception circuit 61 of the driver IC 4A receives the drive stop signal from the host CPU 10, and outputs a low-level signal to the first input terminal of the first AND gate circuit A1 and to the second input terminal of the second AND gate circuit A2.

The first AND gate circuit A1 of the driver IC 4A, which has received the low-level signal from the input reception circuit 61 through the first input terminal at Step S1100, outputs a low-level signal to the third input terminal of the second AND gate circuit A2 at Step S1102. The first AND gate circuit A1 of the driver IC 4A also outputs a low-level drive communication signal Sig11 to the driver IC 4B.

The second AND gate circuit A2 of the driver IC 4A, which has received the low-level signal from the input reception circuit 61 through the second input terminal at Step S1102, outputs a low-level signal to the drive signal output circuit 53 at Step S1104.

The drive signal output circuit 53 of the driver IC 4A, which has received the low-level signal from the second AND gate circuit A2 at Step S1104, stops outputting the drive signals at Step S1106.

The first AND gate circuit A1 of the driver IC 4B, which has received the low-level drive communication signal Sig11 from the driver IC 4A through the second input terminal at Step S1102, outputs a low-level signal to the third input terminal of the second AND gate circuit A2 at Step S1200. The first AND gate circuit A1 of the driver IC 4B also outputs a low-level drive communication signal Sig12 to the driver IC 4C.

The second AND gate circuit A2 of the driver IC 4B, which has received the low-level signal from the first AND gate circuit A1 through the third input terminal at Step S1200, outputs a low-level signal to the drive signal output circuit 53 at Step S1202.

The drive signal output circuit 53 of the driver IC 4B, which has received the low-level signal from the second AND gate circuit A2 at Step S1202, stops outputting the drive signals at Step S1204.

The first AND gate circuit A1 of the driver IC 4C, which has received the low-level drive communication signal Sig12 from the driver IC 4B through the second input terminal at Step S1200, outputs a low-level signal to the third input terminal of the second AND gate circuit A2 at Step S1300. The first AND gate circuit A1 of the driver IC 4C also outputs a low-level drive communication signal Sig13 to the driver IC 4D.

The second AND gate circuit A2 of the driver IC 4C, which has received the low-level signal from the first AND gate circuit A1 through the third input terminal at Step S1300, outputs a low-level signal to the drive signal output circuit 53 at Step S1302.

The drive signal output circuit 53 of the driver IC 4C, which has received the low-level signal from the second AND gate circuit A2 at Step S1302, stops outputting the drive signals at Step S1304.

The first AND gate circuit A1 of the driver IC 4D, which has received the low-level drive communication signal Sig13 from the driver IC 4C through the second input terminal at Step S1300, outputs a low-level signal to the third input terminal of the second AND gate circuit A2 at Step S1400.

The second AND gate circuit A2 of the driver IC 4D, which has received the low-level signal from the first AND gate circuit A1 through the third input terminal at Step S1400, outputs a low-level signal to the drive signal output circuit 53 at Step S1402.

The drive signal output circuit 53 of the driver IC 4D, which has received the low-level signal from the second AND gate circuit A2 at Step S1402, stops outputting the drive signals at Step S1404.

As described above, the driver ICs 4A, 4B, 4C, and 4D stop outputting the drive signals when the driver IC 4A receives a drive stop signal from the host CPU 10.

This configuration can prevent a case in which only the driver IC 4A stops outputting the drive signals while the driver ICs 4B, 4C, and 4D continue to output the drive signals. This configuration can prevent overcurrent among the driver IC 4A and 4B, 4C, or 4D. Thus, the driver ICs 4A, 4B, 4C, and 4D can prevent the display apparatuses 1A and 1B from being affected by the overcurrent.

The driver ICs 4A, 4B, 4C, and 4D stop outputting the drive signals when the driver IC 4B receives a drive stop signal from the host CPU 10.

When the driver IC 4B receives a drive stop signal from the host CPU 10, the driver IC 4B stops outputting the drive signals, outputs a low-level drive communication signal Sig12 to the driver IC 4C, and outputs a low-level drive communication signal Sig16 to the driver IC 4A.

When receiving the low-level drive communication signal Sig16 from the driver IC 4B, the driver IC 4A stops outputting the drive signals.

When receiving the low-level drive communication signal Sig12 from the driver IC 4B, the driver IC 4C stops outputting the drive signals, and outputs a low-level drive communication signal Sig13 to the driver IC 4D.

When receiving the low-level drive communication signal Sig13 from the driver IC 4C, the driver IC 4D stops outputting the drive signals.

The driver ICs 4A, 4B, 4C, and 4D stop outputting the drive signals when the driver IC 4C receives a drive stop signal from the host CPU 10.

When the driver IC 4C receives a drive stop signal from the host CPU 10, the driver IC 4C stops outputting the drive signals, outputs a low-level drive communication signal Sig13 to the driver IC 4D, and outputs a low-level drive communication signal Sig15 to the driver IC 4B.

When receiving the low-level drive communication signal Sig15 from the driver IC 4C, the driver IC 4B stops outputting the drive signals, and outputs a low-level drive communication signal Sig16 to the driver IC 4A.

When receiving the low-level drive communication signal Sig16 from the driver IC 4B, the driver IC 4A stops outputting the drive signals.

When receiving the low-level drive communication signal Sig13 from the driver IC 4C, the driver IC 4D stops outputting the drive signals.

The driver ICs 4A, 4B, 4C, and 4D stop outputting the drive signals when the driver IC 4D receives a drive stop signal from the host CPU 10.

When the driver IC 4D receives a drive stop signal from the host CPU 10, the driver IC 4D stops outputting the drive signals, and outputs a low-level drive communication signal Sig14 to the driver IC 4C.

When receiving the low-level drive communication signal Sig14 from the driver IC 4D, the driver IC 4C stops outputting the drive signals, and outputs a low-level drive communication signal Sig15 to the driver IC 4B.

When receiving the low-level drive communication signal Sig15 from the driver IC 4C, the driver IC 4B stops outputting the drive signals, and outputs a low-level drive communication signal Sig16 to the driver IC 4A.

When receiving the low-level drive communication signal Sig16 from the driver IC 4B, the driver IC 4A stops outputting the drive signals.

Thus, the driver ICs 4A, 4B, 4C, and 4D stop outputting the drive signals when the driver IC 4A, 4B, 4C, or 4D receives a drive stop signal from the host CPU 10.

This configuration can prevent a case in which only one of the driver ICs 4A, 4B, 4C, and 4D stops outputting the drive signals while the others continue to output the drive signals. This configuration can prevent overcurrent among the driver IC 4A, 4B, 4C, or 4D. Thus, the driver ICs 4A, 4B, 4C, and 4D can prevent the display apparatuses 1A and 1B from being affected by the overcurrent.

Third Embodiment

In the first embodiment, two driver ICs 4A and 4B are included in the display apparatus 1. In the second embodiment, four driver ICs 4A, 4B, 4C, and 4D are included in the display apparatuses 1A and 1B. However, the number of the driver ICs is not limited to two or four. In a third embodiment of the present invention, one driver IC is included in a display apparatus.

Figure 13:
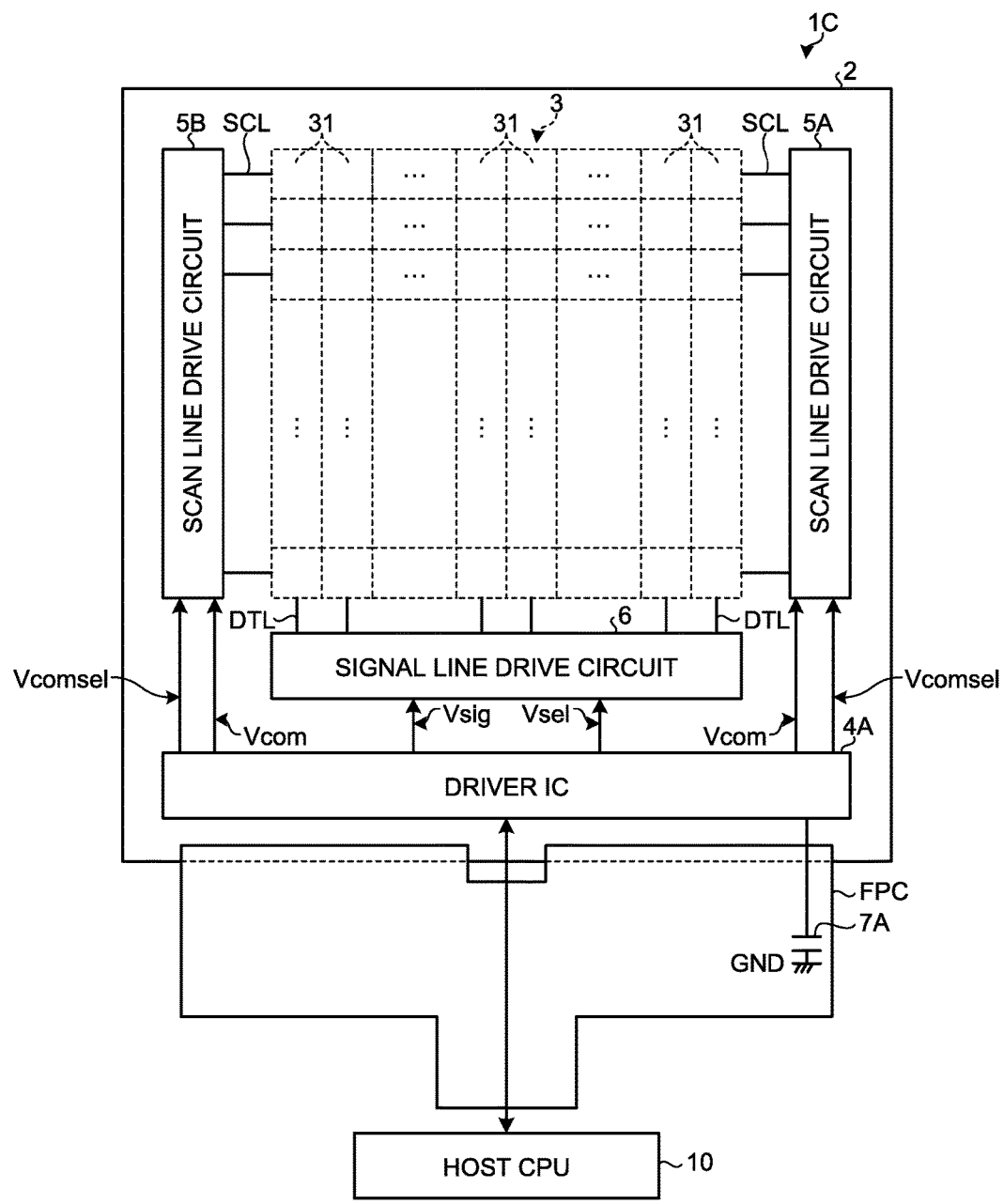
FIG. 13 is a block diagram illustrating an example of a configuration of a display apparatus according to a third embodiment of the present invention.

FIG. 13 is a block diagram illustrating an example of a configuration of a display apparatus according to the third embodiment.

As illustrated in FIG. 13, the display apparatus 1C includes a driver IC 4A that outputs drive signals for driving the pixel group 3.

The driver IC 4A drives M×N pixels 31 in the first to N-th columns.

Figure 14:
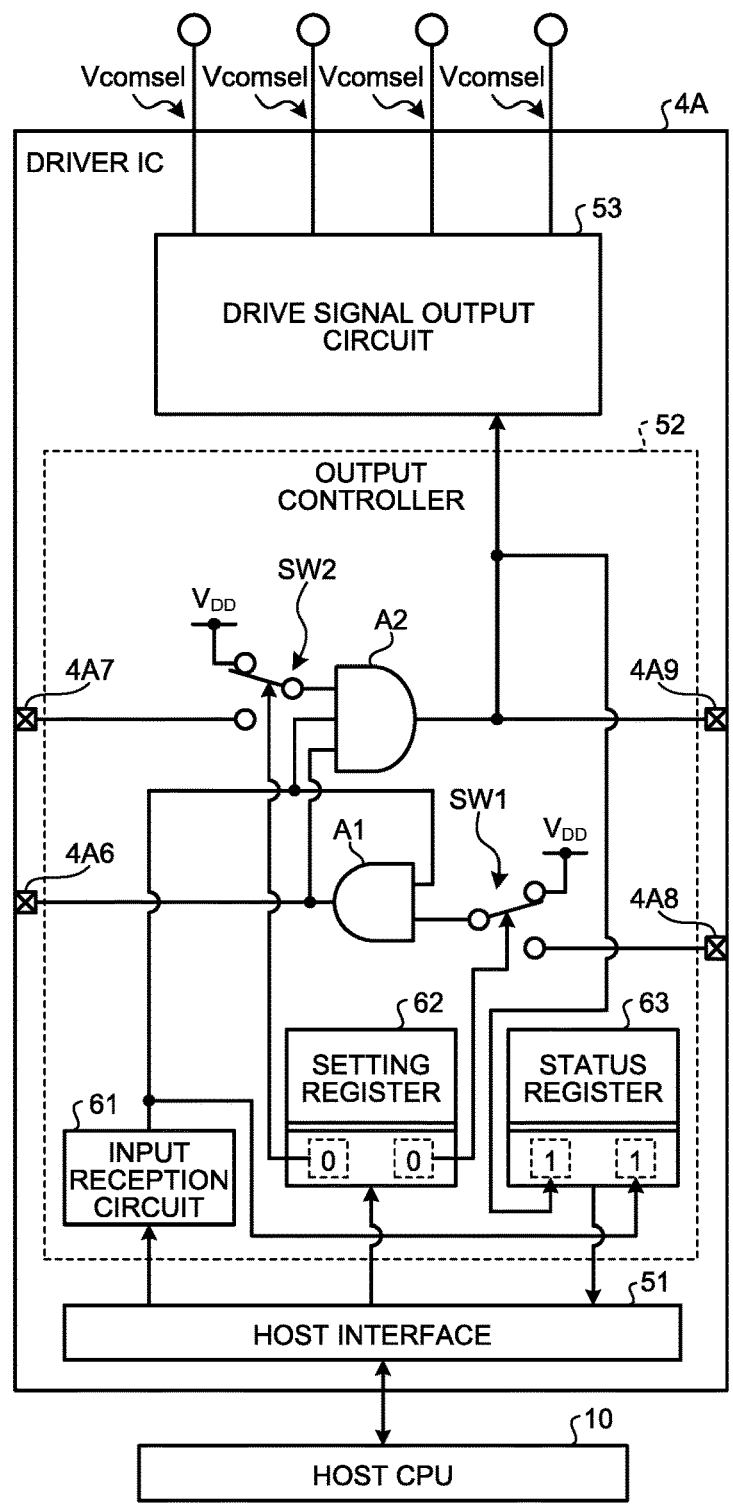
FIG. 14 is a diagram illustrating an inner configuration of a driver IC of the display apparatus according to the third embodiment.

FIG. 14 is a diagram illustrating an inner configuration of the driver IC of the display apparatus according to the third embodiment.

In the third embodiment, the lower bit of the setting register 62 of the driver IC 4A is set to "0" by the host CPU 10. Thus, the second input terminal of the first AND gate circuit A1 of the driver IC 4A receives the power supply potential $V_{DD}$ at the higher voltage level.

The output signal from the first AND gate circuit A1 of the driver IC 4A is a high-level signal when the input reception circuit 61 of the driver IC 4A receives the drive start signal from the host CPU 10, whereas the output signal is a low-level signal when the input reception circuit 61 of the driver IC 4A receives the drive stop signal from the host CPU 10.

The first AND gate circuit A1 of the driver IC 4A outputs the output signal to the third input terminal of the second AND gate circuit A2.

In the third embodiment, the upper bit of the setting register 62 of the driver IC 4A is set to "0" by the host CPU 10. Thus, the first input terminal of the second AND gate circuit A2 of the driver IC 4A receives the power supply potential $V_{DD}$ at the higher voltage level.

The output signal from the second AND gate circuit A2 of the driver IC 4A is a high-level signal when the input reception circuit 61 of the driver IC 4A receives the drive start signal from the host CPU 10. The second AND gate circuit A2 of the driver IC 4A outputs a high-level output signal to the drive signal output circuit 53. This high-level signal causes the drive signal output circuit 53 of the driver IC 4A to start outputting the drive signals.

The output signal from the second AND gate circuit A2 of the driver IC 4A is a low-level signal when the input reception circuit 61 of the driver IC 4A receives the drive stop signal from the host CPU 10. The second AND gate circuit A2 of the driver IC 4A outputs a low-level output signal to the drive signal output circuit 53. This low-level signal causes the drive signal output circuit 53 of the driver IC 4A to stop outputting the drive signals.

The driver IC 4A has the same inner configuration when one driver IC 4A is included in the display apparatus 1C, two driver ICs 4A are included in the display apparatus 1, or four driver ICs 4A are included in the display apparatuses 1A and 1B. This configuration eliminates the need for preparing different types of components depending on the number of the driver ICs 4A, and thus can reduce production costs.

In the first embodiment, two driver ICs 4A and 4B are included in the display apparatus 1. In the second embodiment, four driver ICs 4A, 4B, 4C, and 4D are included in the display apparatuses 1A and 1B. In the third embodiment, one driver IC 4A is included in the display apparatus 1C. However, the number of the driver ICs is not limited to one, two, or four. Three driver ICs or five or more driver ICs may be included in a display apparatus.

Fourth Embodiment

Figure 15:
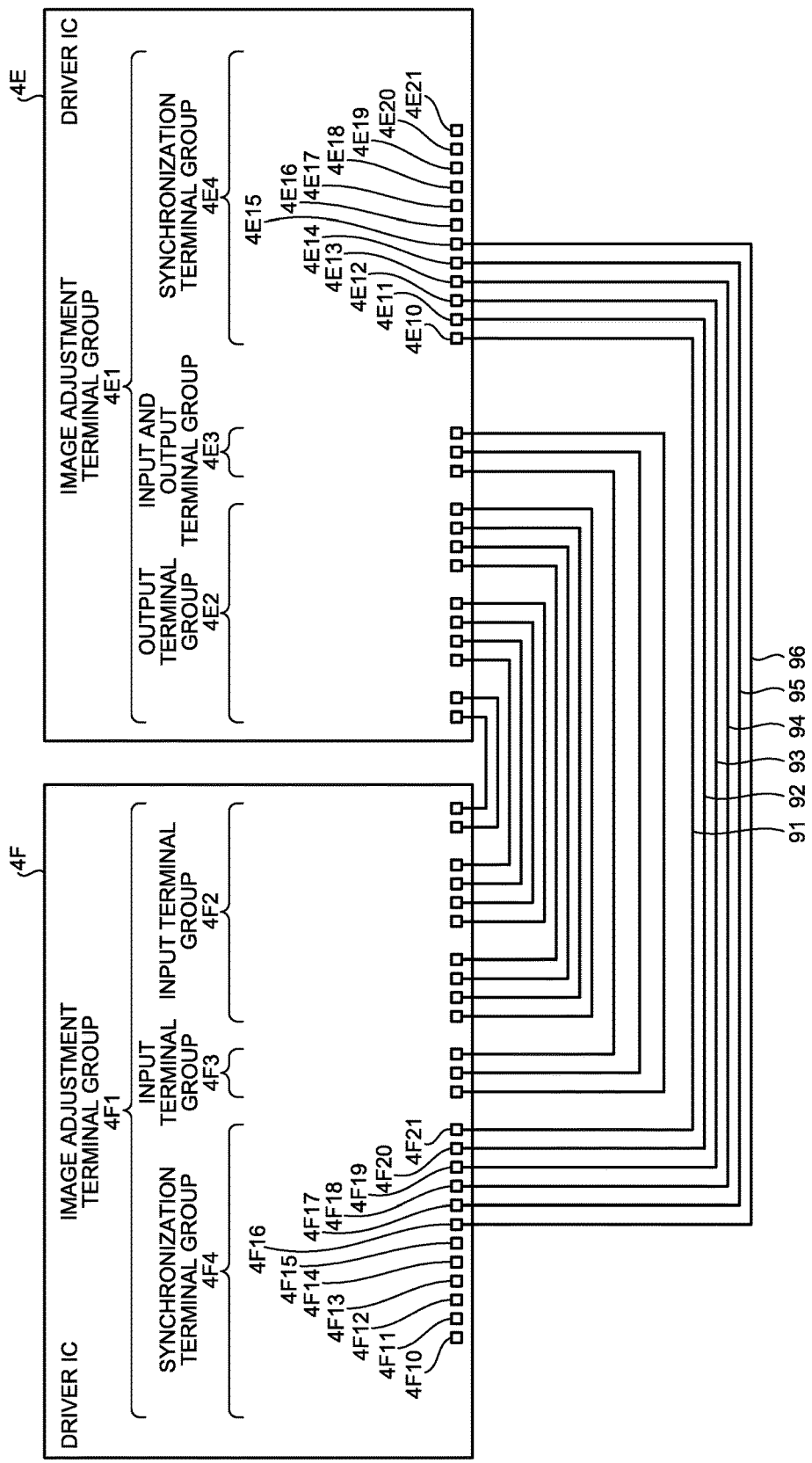
FIG. 15 is a diagram illustrating how driver ICs of a display apparatus are coupled to each other according to a fourth embodiment of the present invention.

FIG. 15 is a diagram illustrating how driver ICs of a display apparatus according to a fourth embodiment of the present invention are coupled to each other. In the fourth embodiment, two driver ICs 4E and 4F are included in a display apparatus.

The driver ICs 4E and 4F according to the fourth embodiment can be mounted on the display apparatus 1 (see FIG. 1) instead of the driver ICs 4A and 4B according to the first embodiment.

The driver IC 4F drives M×i pixels 31 in the first to i-th columns (i is a natural number where $1 \leq i < N$ is satisfied). The driver IC 4E dives M×(N−i) pixels 31 in the (i+1)-th to N-th columns.

The driver IC 4E includes an image adjustment terminal group 4E1 for transmitting and receiving signals for adjusting an image displayed by M×(N−i) pixels 31 in the (i+1)-th to N-th columns driven by the driver IC 4E, and an image displayed by M×i pixels 31 in the first to i-th columns driven by the driver IC 4F.

The driver IC 4F includes an image adjustment terminal group 4F1 for transmitting and receiving signals for adjusting an image displayed by M×i pixels 31 in the first to i-th columns driven by the driver IC 4F, and an image displayed by M×(N−i) pixels 31 in the (I+1)-th to N-th columns driven by the driver IC 4E.

The driver ICs 4E and 4F can adjust images displayed by the pixel group 3 by transmitting and receiving signals between the image adjustment terminal groups 4E1 and 4F1.

The driver ICs 4E and 4F transmit and receive signals for adjusting the images displayed by the pixel group 3 in a time period from when the driver ICs 4E and 4F start outputting the drive signals to when they stop outputting the drive signals.

Thus, the driver ICs 4E and 4F can use synchronization terminal groups 4E4 and 4F4 to transmit and receive signals other than the signals for adjusting the images displayed by the pixel group 3 in a time period other than the time period from when the driver ICs 4E and 4F start outputting the drive signals to when they stop outputting the drive signals.

In the fourth embodiment, the driver ICs 4E and 4F are configured to transmit and receive the drive communication signal between the synchronization terminal groups 4E4 and 4F4.

This configuration can eliminate the need for providing the drive communication terminal groups in addition to the synchronization terminal groups to the driver ICs 4E and 4F. The driver ICs 4E and 4F can use the synchronization terminal groups 4E4 and 4F4 as terminals for transmitting and receiving the drive communication signal. This configuration can reduce the production costs of the driver ICs 4E and 4F and also reduce the footprint thereof.

The image adjustment terminal group 4E1 includes an output terminal group 4E2 for transmitting signals from the driver IC 4E to the driver IC 4F, an input and output terminal group 4E3 for transmitting signals from the driver IC 4E to the driver IC 4F and receiving signals from the driver IC 4F to the driver IC 4E, and the synchronization terminal group 4E4 for synchronizing the driver IC 4E with the driver IC 4F. The synchronization terminal group 4E4 includes 12 terminals that are synchronization terminals 4E10 to 4E21.

The image adjustment terminal group 4F1 includes an input terminal group 4F2 for receiving signals from the driver IC 4E to the driver IC 4F, an input terminal group 4F3 for receiving signals from the driver IC 4E to the driver IC 4F, and the synchronization terminal group 4F4 for synchronizing the driver IC 4F with the driver IC 4E. The synchronization terminal group 4F4 includes 12 terminals that are synchronization terminals 4F10 to 4F21.

The synchronization terminal 4E10 is electrically coupled to the synchronization terminal 4F21 via wiring 91. The synchronization terminal 4E11 is electrically coupled to the synchronization terminal 4F20 via wiring 92. The synchronization terminal 4E12 is electrically coupled to the synchronization terminal 4F19 via wiring 93.

The synchronization terminal 4E13 is electrically coupled to the synchronization terminal 4F18 via wiring 94. The synchronization terminal 4E14 is electrically coupled to the synchronization terminal 4F17 via wiring 95. The synchronization terminal 4E15 is electrically coupled to the synchronization terminal 4F16 via wiring 96.

The synchronization terminals 4E16 to 4E21 are electrically coupled to other driver ICs when the display apparatus includes three or more driver ICs. In the fourth embodiment, the display apparatus includes two driver ICs 4E and 4F. Thus, the synchronization terminals 4E16 to 4E21 are left uncoupled.

The synchronization terminals 4F10 to 4F15 are electrically coupled to other driver ICs when the display apparatus includes three or more driver ICs. In the fourth embodiment, the display apparatus includes two driver ICs 4E and 4F. Thus, the synchronization terminals 4F10 to 4F15 are left uncoupled.

Figure 16:
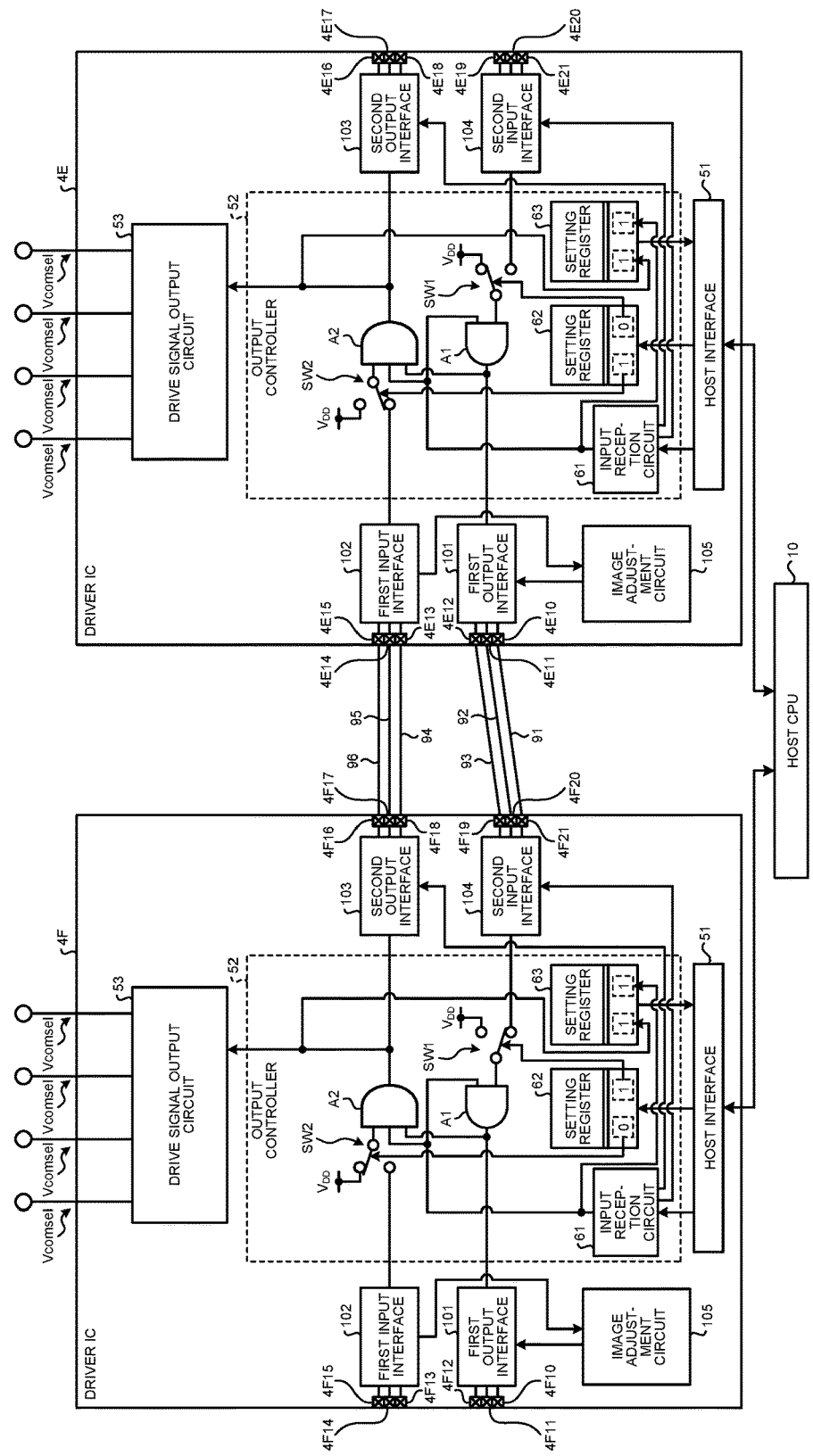
FIG. 16 is a diagram illustrating an inner configuration of the driver ICs of the display apparatus according to the fourth embodiment.

FIG. 16 is a diagram illustrating an inner configuration of the driver ICs of the display apparatus according to the fourth embodiment.

The driver ICs 4E and 4F have the same inner configuration. This configuration eliminates the need for preparing different types of components for the driver ICs 4E and 4F, and thus can reduce production costs.

The driver ICs 4E and 4F each include a first output interface 101, a first input interface 102, a second output interface 103, a second input interface 104, and an image adjustment circuit 105 in addition to the host interface 51, the output controller 52, and the drive signal output circuit 53.

The image adjustment circuit 105 of the driver ICs 4E and 4F is a circuit for adjusting images displayed by the pixel group 3. The image adjustment circuit 105 calculates and stores therein an adjustment value for adjusting an output signal in accordance with an input signal. The image adjustment circuit 105 of the driver IC 4E and that of the driver IC 4F can adjust images displayed by the pixel group 3 by transmitting and receiving the adjustment value that has been calculated and stored between the image adjustment terminal groups 4E1 and 4F1.

The first output interface 101 and the second output interface 103 of the driver ICs 4E and 4F are circuits for outputting signals to other driver ICs. The first input interface 102 and the second input interface 104 of the driver ICs 4E and 4F are circuits for receiving signals from other driver ICs.

The first output interface 101, the first input interface 102, the second output interface 103, and the second input interface 104 of the driver ICs 4E and 4F are, for example, serial peripheral interfaces (SPIs).

The first output interface 101 of the driver IC 4E outputs a signal for adjusting the image displayed by the pixel group 3 to the driver IC 4F in a time period from when the drive signal output circuit 53 starts outputting the drive signals to when it stops outputting the drive signals. The first output interface 101 of the driver IC 4E outputs the drive communication signal Sig1 output from the first AND gate circuit A1 to the driver IC 4F in a time period other than the time period from when the drive signal output circuit 53 starts outputting the drive signals to when it stops outputting the drive signals.

The second input interface 104 of the driver IC 4F receives the signal for adjusting the image displayed by the pixel group 3 from the driver IC 4E in the time period from when the drive signal output circuit 53 starts outputting the drive signals to when it stops outputting the drive signals. The second input interface 104 of the driver IC 4F receives the drive communication signal Sig1 from the driver IC 4E in a time period other than the time period from when the drive signal output circuit 53 starts outputting the drive signals to when it stops outputting the drive signals.

The second output interface 103 of the driver IC 4F outputs a signal for adjusting the image displayed by the pixel group 3 to the driver IC 4E in the time period from when the drive signal output circuit 53 starts outputting the drive signals to when it stops outputting the drive signals. The second output interface 103 of the driver IC 4F outputs the drive communication signal Sig2 output from the second AND gate circuit A2 to the driver IC 4E in a time period other than the time period from when the drive signal output circuit 53 starts outputting the drive signals to when it stops outputting the drive signals.

The first input interface 102 of the driver IC 4E receives the signal for adjusting the image displayed by the pixel group 3 from the driver IC 4F in the time period from when the drive signal output circuit 53 starts outputting the drive signals to when it stops outputting the drive signals. The first input interface 102 of the driver IC 4E receives the drive communication signal Sig2 from the driver IC 4F in a time period other than the time period from when the drive signal output circuit 53 starts outputting the drive signals to when it stops outputting the drive signals.

The setting register 62 of the driver IC 4E is set to "10" by the host CPU 10 in the same manner as in the driver IC 4A according to the first embodiment.

The setting register 62 of the driver IC 4F is set to "01" by the host CPU 10 in the same manner as in the driver IC 4B according to the first embodiment.

The flowchart illustrating the operation of the driver ICs 4A and 4B to start outputting the drive signals is the same as the flowchart illustrated in FIG. 5 in the first embodiment, and thus the flowchart and the explanation thereof are omitted.

Figure 17:
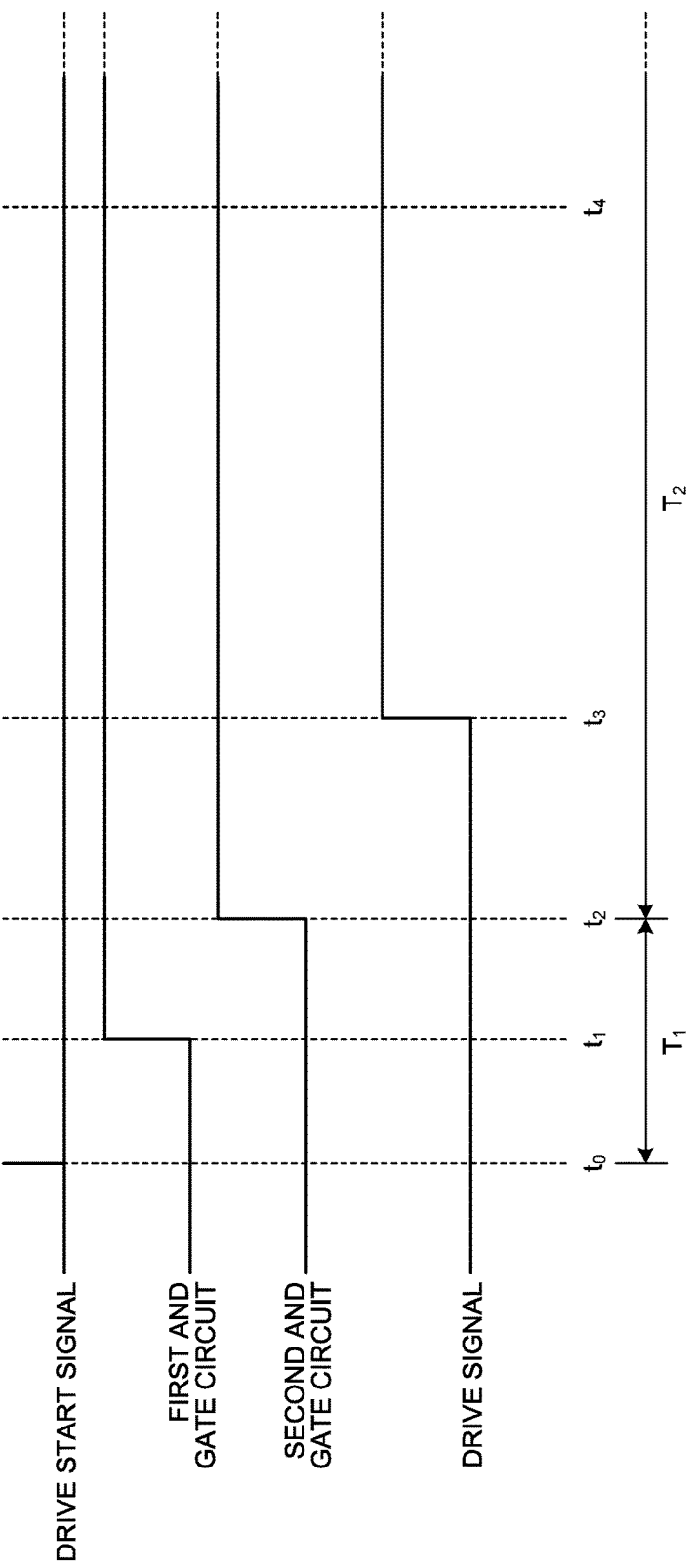
FIG. 17 is a timing diagram illustrating operation timing of the driver ICs of the display apparatus according to the fourth embodiment.

FIG. 17 is a timing diagram illustrating operation timing of the driver ICs of the display apparatus according to the fourth embodiment. The timing diagram in FIG. 17 illustrates the operation timing at which the driver ICs 4E and 4F start outputting the drive signals.

The host CPU 10 outputs a drive start signal to the driver ICs 4E and 4F at timing $t_0$.

The first AND gate circuit A1 of the driver ICs 4E and 4F outputs a high-level signal at timing $t_1$ (see Steps S102 and S202 in FIG. 5).

The second AND gate circuit A2 of the driver ICs 4E and 4F outputs a high-level signal at timing $t_2$ (see Steps S104 and S204 in FIG. 5).

The drive signal output circuit 53 of the driver ICs 4E and 4F starts outputting the drive signals at timing $t_3$ (see Steps S106 and S206 in FIG. 5).

Subsequently, at timing $t_4$, the pixel group 3 starts displaying an image.

A time period $T_1$ from the timing $t_0$ to the timing $t_2$ is the time period in which the drive communication signals Sig1 and Sig2 are transmitted and received.

A time period $T_2$ after the timing $t_2$ is the time period in which signals for adjusting the image displayed by the pixel group 3 are transmitted and received.

The flowchart illustrating the operation of the driver ICs 4E and 4F when stopping outputting the drive signals is the same as the flowchart illustrated in FIG. 6 or 7 in the first embodiment, and thus the flowchart and the explanation thereof are omitted.

Figure 18:
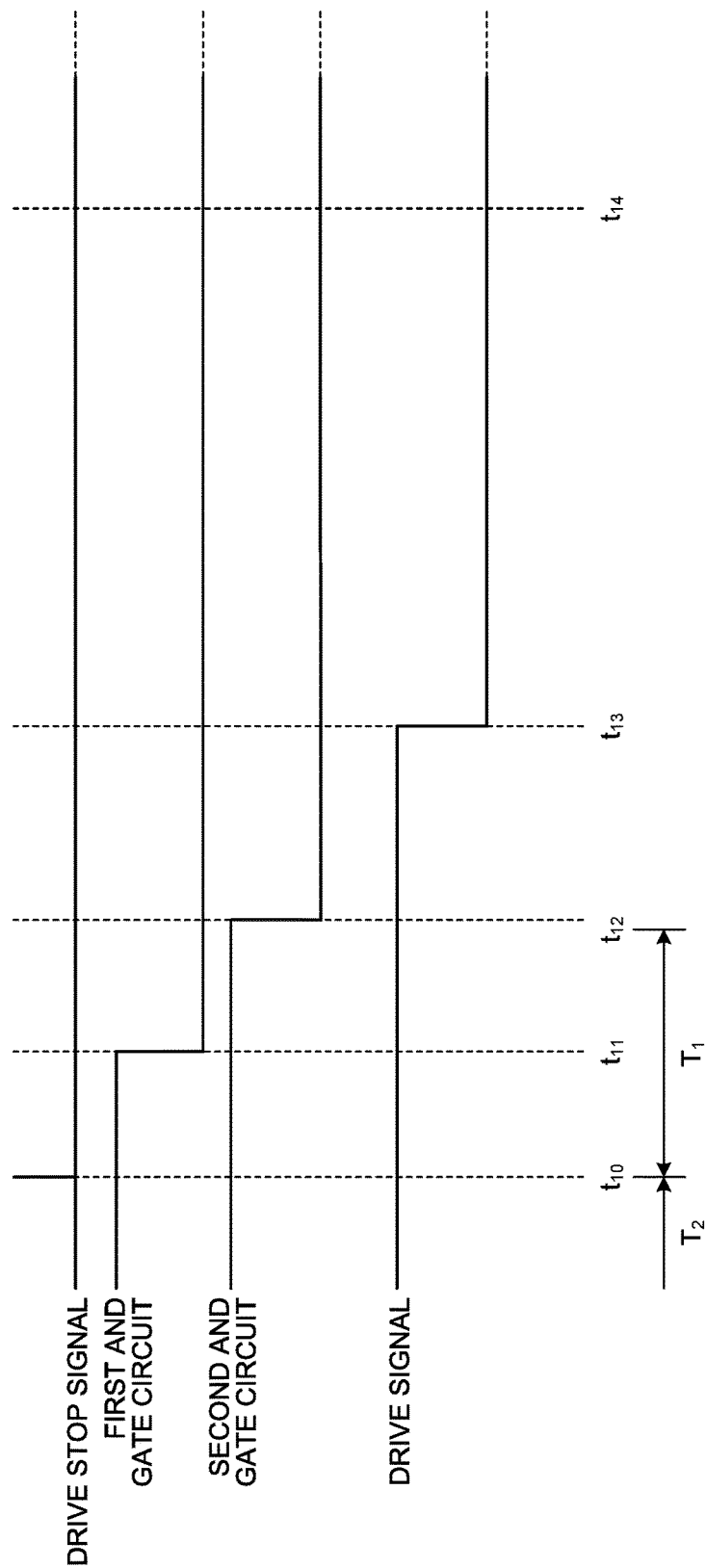
FIG. 18 is a timing diagram illustrating operation timing of the driver ICs of the display apparatus according to the fourth embodiment.

FIG. 18 is a timing diagram illustrating operation timing of the driver ICs of the display apparatus according to the fourth embodiment. The timing diagram in FIG. 18 illustrates the operation timing at which the driver ICs 4E and 4F stop outputting the drive signals.

The host CPU 10 outputs a drive stop signal to the driver IC 4E at timing $t_{10}$.

The first AND gate circuit A1 of the driver ICs 4E and 4F outputs a low-level signal at timing $t_{11}$ (see Steps S302 and S400 in FIG. 6).

The second AND gate circuit A2 of the driver ICs 4E and 4F outputs a low-level signal at timing $t_{12}$ (see Steps S304 and S402 in FIG. 6).

The drive signal output circuit 53 of the driver ICs 4E and 4F stops outputting the drive signals at timing $t_{13}$ (see Steps S306 and S404 in FIG. 6).

Subsequently, at timing $t_{14}$, the pixel group 3 stops displaying the image.

The time period $T_2$ until the timing $t_{10}$ is the time period in which signals for adjusting the image displayed by the pixel group 3 are transmitted and received.

The time period $T_1$ from the timing $t_{10}$ to the timing $t_{12}$ is the time period in which the drive communication signals Sig1 and Sig2 are transmitted and received.

As described above, the driver ICs 4E and 4F can use the image adjustment terminal groups 4E1 and 4F1 that transmit and receive signals for adjusting the image displayed by the pixel group 3 as terminals for transmitting and receiving the drive communication signals Sig1 and Sig2. In other words, the image adjustment terminal groups 4E1 and 4F1 can be used for transmitting and receiving the signals for adjusting the image displayed by the pixel group 3 and also for transmitting and receiving the drive communication signals Sig1 and Sig2.

This configuration eliminates the need for installing the drive communication terminal groups in addition to the image adjustment terminal groups 4E1 and 4F1 in the driver ICs 4E and 4F, thereby reducing the total number of terminals.

This configuration can reduce the production costs of the driver ICs 4E and 4F and also reduce the footprint thereof.

The driver ICs 4E and 4F have the same inner configuration. This configuration eliminates the need for preparing different types of components for the driver ICs 4E and 4F, and thus can reduce production costs.

Fifth Embodiment

In the fourth embodiment, two driver ICs 4E and 4F are included in the display apparatus 1, but the number of the driver ICs is not limited to two. In a fifth embodiment of the present invention, four driver ICs are included in a display apparatus.

Figure 19:
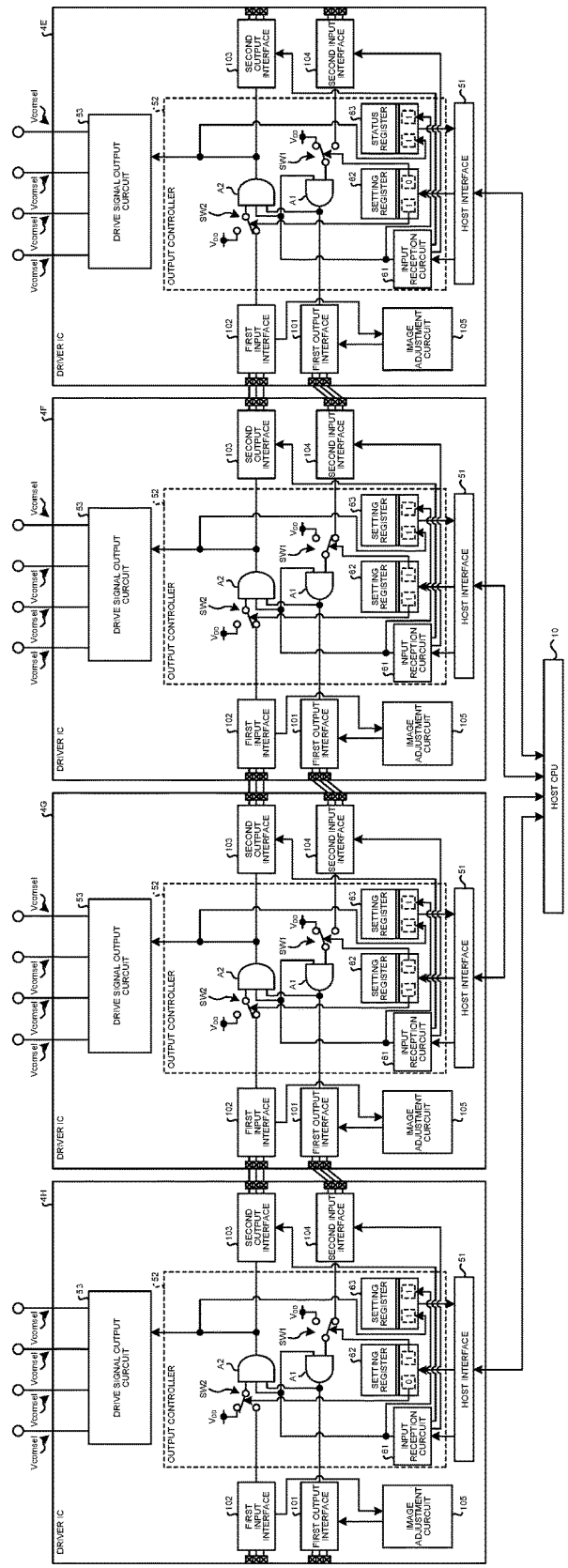
FIG. 19 is a diagram illustrating an inner configuration of driver ICs of a display apparatus according to a fifth embodiment of the present invention.

FIG. 19 is a diagram illustrating an inner configuration of the driver ICs of the display apparatus according to the fifth embodiment.

Driver ICs 4E, 4F, 4G, and 4H according to the fifth embodiment can be mounted on the display apparatus 1A or 1B (see FIG. 8 or 9) instead of the driver ICs 4A, 4B, 4C, and 4D according to the second embodiment.

The driver ICs 4E, 4F, 4G, and 4H have the same inner configuration. This configuration eliminates the need for preparing different types of components for the driver ICs 4E, 4F, 4G, and 4H, and thus can reduce production costs.

The driver ICs 4E, 4F, 4G, and 4H are electrically coupled to one another.

The driver ICs 4E, 4F, 4G, and 4H output and receive, to and from one another, a drive communication signal indicating reception of the drive start signal to start driving the pixels 31. When all the driver ICs 4E, 4F, 4G, and 4H receive the drive communication signal indicating that all the driver ICs have received the drive start signal, the driver ICs 4E, 4F, 4G, and 4H start outputting the drive signals.

The setting register 62 of the driver IC 4E is set to "10" by the host CPU 10 in the same manner as in the driver IC 4A according to the second embodiment.

The setting register 62 of the driver IC 4F is set to "11" by the host CPU 10 in the same manner as in the driver IC 4B according to the second embodiment.

The setting register 62 of the driver IC 4G is set to "11" by the host CPU 10 in the same manner as in the driver IC 4C according to the second embodiment.

The setting register 62 of the driver IC 4H is set to "01" by the host CPU 10 in the same manner as in the driver IC 4D according to the second embodiment.

The flowchart illustrating the operation of the driver ICs 4E, 4F, 4G, and 4H to start outputting the drive signals is the same as the flowchart illustrated in FIG. 11 in the second embodiment.

The timing diagram illustrating the operation timing at which the driver ICs 4E, 4F, 4G, and 4H start outputting the drive signals is the same as the timing diagram illustrated in FIG. 17 in the fourth embodiment.

The flowchart illustrating the operation of the driver ICs 4E, 4F, 4G, and 4H when stopping outputting the drive signals is the same as the flowchart illustrated in FIG. 12 in the second embodiment.

The timing diagram illustrating the operation timing at which the driver ICs 4E, 4F, 4G, and 4H stop outputting the drive signals is the same as the timing diagram illustrated in FIG. 18 in the fourth embodiment.

The driver ICs 4E, 4F, 4G, and 4H can use the image adjustment terminal groups that transmit and receive signals for adjusting the image displayed by the pixel group 3 as terminals for transmitting and receiving the drive communication signals Sig11 to Sig16. In other words, the image adjustment terminal groups can be used for transmitting and receiving the signals for adjusting the image displayed by the pixel group 3 and also for transmitting and receiving the drive communication signals Sig11 to Sig16.

This configuration eliminates the need for providing the drive communication terminal groups in addition to the image adjustment terminal groups in the driver ICs 4E, 4F, 4G, and 4H, thereby reducing the total number of terminals.

This configuration can reduce the production costs of the driver ICs 4E, 4F, 4G, and 4H and also reduce the footprint thereof.

The driver ICs 4E, 4F, 4G, and 4H have the same inner configuration. This configuration eliminates the need for preparing different types of components for the driver ICs 4E, 4F, 4G, and 4H, and thus can reduce production costs.

Sixth Embodiment

In the fourth embodiment, two driver ICs 4E and 4F are included in a display apparatus. In the fifth embodiment, four driver ICs 4E, 4F, 4G, and 4H are included in a display apparatus. However, the number of the driver ICs is not limited to two or four. In a sixth embodiment of the present invention, one driver IC is included in a display apparatus.

Figure 20:
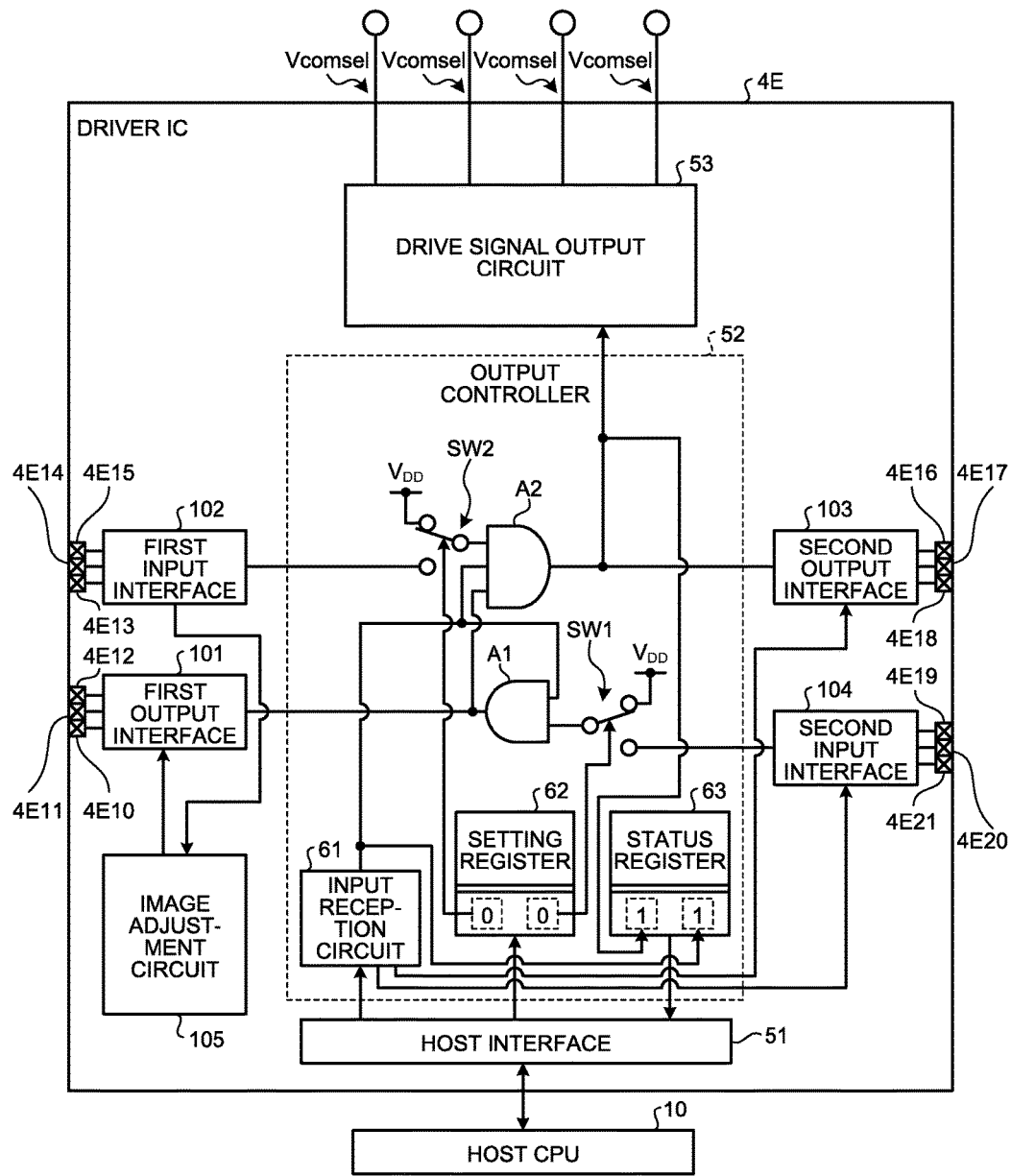
FIG. 20 is a diagram illustrating an inner configuration of a driver IC of a display apparatus according to a sixth embodiment of the present invention.

FIG. 20 is a diagram illustrating an inner configuration of the driver IC of the display apparatus according to the sixth embodiment.

The driver IC 4E according to the sixth embodiment can be mounted on the display apparatus 1C (see FIG. 13) instead of the driver IC 4A according to the third embodiment.

The setting register 62 of the driver IC 4E is set to "00" by the host CPU 10 in the same manner as in the driver IC 4A according to the third embodiment.

The output signal from the first AND gate circuit A1 of the driver IC 4E is a high-level signal when the input reception circuit 61 of the driver IC 4E receives the drive start signal from the host CPU 10, whereas the output signal is a low-level signal when the input reception circuit 61 of the driver IC 4E receives the drive stop signal from the host CPU 10.

The first AND gate circuit A1 of the driver IC 4E outputs the output signal to the third input terminal of the second AND gate circuit A2.

The output signal from the second AND gate circuit A2 of the driver IC 4E is a high-level signal when the input reception circuit 61 of the driver IC 4E receives the drive start signal from the host CPU 10. The second AND gate circuit A2 of the driver IC 4E outputs a high-level output signal to the drive signal output circuit 53. This high-level signal causes the drive signal output circuit 53 of the driver IC 4E to start outputting the drive signals.

The output signal from the second AND gate circuit A2 of the driver IC 4E is a low-level signal when the input reception circuit 61 of the driver IC 4E receives the drive stop signal from the host CPU 10. The second AND gate circuit A2 of the driver IC 4E outputs a low-level output signal to the drive signal output circuit 53. This low-level signal causes the drive signal output circuit 53 of the driver IC 4E to stop outputting the drive signals.

The driver IC 4E has the same inner configuration when one driver IC 4E is included in the display apparatus 1C, two driver ICs 4E are included in the display apparatus 1, or four driver ICs 4E are included in the display apparatuses 1A and 1B. This configuration eliminates the need for preparing different types of components depending on the number of the driver IC 4E, and thus can reduce production costs.

In the fourth embodiment, two driver ICs 4E and 4F are included in the display apparatus 1. In the fifth embodiment, four driver ICs 4E, 4F, 4G, and 4H are included in the display apparatuses 1A and 1B. In the sixth embodiment, one driver IC 4E is included in the display apparatus 1C. However, the number of the driver ICs is not limited to one, two, or four. Three driver ICs or five or more driver ICs may be included in a display apparatus.

Preferred embodiments of the present invention have been described, but are not intended to limit the scope of the present invention. Components disclosed in the embodiments above are presented for illustrative purposes only, and various modifications can be made without departing from the scope of the present invention. The modifications made as appropriate without departing from the gist of the present invention should also be understood to fall within the scope of the present invention.

What is claimed is:

1. A display apparatus comprising:
   a plurality of pixels formed on a substrate;
   a plurality of semiconductor apparatuses, each of which is coupled to a part of the pixels, including a first semiconductor apparatus and a second semiconductor apparatus; and
   wiring including a first wiring and a second wiring, each of which couples the first semiconductor apparatus and the second semiconductor apparatus, wherein
   each semiconductor apparatus includes
      a drive signal output circuit configured to output a drive signal to the part of the pixels;
      an output controller configured to control the drive signal output circuit; and
      an external input interface configured to receive a drive start signal,
   wherein
   the output controller of the first semiconductor apparatus is configured to:
      output a first drive start communication signal to the second semiconductor apparatus via the first wiring after the external input interface of the first semiconductor apparatus received the drive start signal;
      receive a second drive start communication signal from the second semiconductor apparatus via the second wiring after the external input interface of the second semiconductor apparatus received the drive start signal and the output controller of the second semiconductor apparatus receives the first drive start communication signal via the first wiring; and
      cause the drive signal output circuit of the first semiconductor apparatus to output the drive signal after the output controller of the first semiconductor apparatus receives the second drive start communication signal.

2. The display apparatus according to claim 1, wherein each of the external input interface of the first semiconductor apparatus and the external input interface of the second semiconductor apparatus individually receives the drive start signal.

3. The display apparatus according to claim 1, wherein after the external input interface of the second semiconductor apparatus received the drive start signal and the output controller of the second semiconductor apparatus received the first drive start communication signal from the first semiconductor apparatus via the first wiring,
   the output controller of the second semiconductor apparatus is configured to:
      output the second drive start communication signal to the first semiconductor apparatus via the second wiring; and
      cause the drive signal output circuit of the second semiconductor apparatus to output the drive signal.

4. The display apparatus according to claim 1, wherein the semiconductor apparatuses further include a third semiconductor apparatus,
   wherein the wiring includes third wiring that couples the first semiconductor apparatus and the third semiconductor apparatus, and
   wherein the output controller of the first semiconductor apparatus is configured to:
   receive a third drive start communication signal from the third semiconductor apparatus via the third wiring after the external input interface of the third semiconductor apparatus received the drive start signal; and
   output the first drive start communication signal to the second semiconductor apparatus via the first wiring after the external input interface of the first semiconductor apparatus received the drive start signal and the output controller of the first semiconductor apparatus received the third drive start communication signal.

5. The display apparatus according to claim 4, wherein the wiring includes fourth wiring that couples the first semiconductor apparatus and the third semiconductor apparatus, and
   wherein the output controller of the first semiconductor apparatus is configured to output a fourth drive start communication signal to the third semiconductor apparatus via the fourth wiring after the output controller of the first semiconductor apparatus received the second drive start communication signal.

6. The display apparatus according to claim 4, wherein the wiring includes fourth wiring that couples the first semiconductor apparatus and the third semiconductor apparatus,
   the output controller of the third semiconductor apparatus is configured to:
   output the third drive start communication signal to the first semiconductor apparatus via the third wiring after the external input interface of the third semiconductor apparatus received the drive start signal; and
   cause the drive signal output circuit of the third semiconductor apparatus to output the drive signal after receiving the fourth drive start communication signal from the first semiconductor apparatus via the fourth wiring.

7. The display apparatus according to claim 1, wherein the external input interface is configured to receive a drive stop signal,
   wherein the output controller of the first semiconductor apparatus is configured to:
   output a first drive stop communication signal after the external input interface of the first semiconductor apparatus received the drive stop signal; and
   after the external input interface of the first semiconductor apparatus received the drive stop signal or the output controller of the first semiconductor apparatus received a second drive stop communication signal from the second semiconductor apparatus via the second wiring, cause the drive signal output circuit of the first semiconductor apparatus to stop outputting the drive signal.

8. The display apparatus according to claim 7, wherein after the external input interface of the second semiconductor apparatus received the drive stop signal or the output controller of the second semiconductor apparatus received the first drive stop communication signal from the first semiconductor apparatus via the first wiring,
   the output controller of the second semiconductor apparatus is configured to:

cause the drive signal output circuit of the second semiconductor apparatus to stop outputting the drive signal; and output the second drive stop communication signal to the first semiconductor apparatus via the second wiring.

9. The display apparatus according to claim 1, wherein each semiconductor apparatus includes a plurality of terminals configured to output and receive the drive start communication signal or the second drive start communication signal to and from other semiconductor apparatuses.

10. The display apparatus according to claim 1, wherein each semiconductor apparatus includes a plurality of terminals configured to output and receive the drive start communication signal or the second drive start communication signal to and from other semiconductor apparatuses and output and receive a signal for adjusting an image displayed by the pixels to and from the other semiconductor apparatuses.

11. The display apparatus according to claim 1, wherein
the output controller of the first semiconductor apparatus includes a logical AND operation circuit, and
the logical AND operation circuit is configured to
perform a logical AND operation in accordance with the drive start signal received by the first semiconductor apparatus and the drive start signal received by the second semiconductor apparatus, and
output a result of the logical AND operation to the drive signal output circuit of the first semiconductor apparatus.

12. The display apparatus according to claim 4, wherein
the output controller of the first semiconductor apparatus includes
a first logical AND operation circuit including
a first input terminal to which the drive start signal received by the first semiconductor apparatus is input and
a second input terminal to which the third drive start communication signal received from the third semiconductor apparatus is input,
the first logical AND operation circuit configured to perform a logical AND operation in accordance with the signals input to the first and second input terminals, and
a second logical AND operation circuit including
a first input terminal to which the second drive start communication signal received from the second semiconductor apparatus is input,
a second input terminal to which the drive start signal received by the first semiconductor apparatus is input, and a third input terminal to which an output signal from the first logical AND operation circuit is input,
the second logical AND operation circuit configured to
perform a logical AND operation in accordance with the signals input to the first, second, and third input terminals, and
output a result of the logical AND operation to the drive signal output circuit of the first semiconductor apparatus.

13. The display apparatus according to claim 12, wherein
the output controller includes
a first switch circuit configured to input either of
the third drive start communication signal received from the third semiconductor apparatus or
a power supply potential at a higher voltage level
to the second input terminal of the first logical AND operation circuit, and
a second switch circuit configured to input either of
the second drive start communication signal received from the second semiconductor apparatus or
the power supply potential at the higher voltage level
to the first input terminal of the second logical AND operation circuit.

14. The display apparatus according to claim 12, wherein
the output controller of the first semiconductor apparatus includes a status register a value of which is readable from outside, and
the drive start signal or a drive stop signal to stop driving the pixels received by the output controller of the first semiconductor apparatus and an output signal from the second logical AND operation circuit are set to the status register.

15. The display apparatus according to claim 13, wherein
the output controller of the first semiconductor apparatus includes a setting register a value of which is writable from outside,
the setting register is configured to control the first switch circuit to input the power supply potential at the higher voltage level to the second input terminal of the first logical AND operation circuit when the first semiconductor apparatus is located at an end of the semiconductor apparatuses coupled via the wiring, and
the setting register is configured to
control the second switch circuit to input the power supply potential at the higher voltage level to the first input terminal of the second logical AND operation circuit
when the first semiconductor apparatus located at the other end of the semiconductor apparatuses coupled via the wiring.

16. A control method performed by a plurality of semiconductor apparatuses including a first semiconductor apparatus and a second semiconductor apparatus coupled to the first semiconductor apparatus via first wiring and second wiring, each of which is coupled to a part of a plurality of pixels, the part being different for each semiconductor apparatus,
the control method of the first semiconductor apparatus comprising:
outputting a first drive start communication signal to the second semiconductor apparatus via the first wiring after receiving a drive start signal to start driving the pixels; and
receiving a second drive start communication signal from the second semiconductor apparatus via the second wiring after the second semiconductor apparatus received the drive start signal; and
starting outputting the drive signal.

* * * * *